US012733146B2

(12) United States Patent
Sharma et al.

(10) Patent No.: US 12,733,146 B2
(45) Date of Patent: Sep. 8, 2026

(54) STATIC RANDOM-ACCESS MEMORY DEVICES WITH ANGLED TRANSISTORS

(71) Applicant: Intel Corporation, Santa Clara, CA (US)

(72) Inventors: Abhishek A. Sharma, Portland, OR (US); Sagar Suthram, Portland, OR (US); Kimberly L. Pierce, Beaverton, OR (US); Elliot Tan, Portland, OR (US); Pushkar Sharad Ranade, San Jose, CA (US); Shem Odhiambo Ogadhoh, West Linn, OR (US); Wilfred Gomes, Portland, OR (US); Anand S. Murthy, Portland, OR (US); Swaminathan Sivakumar, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 542 days.

(21) Appl. No.: 18/312,847

(22) Filed: May 5, 2023

(65) Prior Publication Data

US 2023/0422463 A1 Dec. 28, 2023

Related U.S. Application Data

(63) Continuation of application No. PCT/US2022/034565, filed on Jun. 22, 2022.

(51) Int. Cl.

| | |
|---|---|
| ***H10B 10/00*** | (2023.01) |
| ***G11C 5/06*** | (2006.01) |
| ***G11C 7/18*** | (2006.01) |

(52) U.S. Cl.
CPC .......... *H10B 10/125* (2023.02); *G11C 5/063* (2013.01); *G11C 7/18* (2013.01)

(58) Field of Classification Search
CPC ........ H10B 10/125; G11C 5/063; G11C 7/18; H10D 89/10
See application file for complete search history.

(56) References Cited

U.S. PATENT DOCUMENTS

| | | |
|---|---|---|
| 5,218,568 A | 6/1993 | Lin et al. |
| 5,412,596 A | 5/1995 | Hoshiba |

(Continued)

FOREIGN PATENT DOCUMENTS

| | | |
|---|---|---|
| JP | 2004146626 A | 5/2004 |
| WO | 2018111215 A1 | 6/2018 |

(Continued)

*Primary Examiner* — Eliseo Ramos Feliciano
*Assistant Examiner* — Sophia W Kao
(74) *Attorney, Agent, or Firm* — Akona IP PC

(57) ABSTRACT

SRAM devices with angled transistors, and related assemblies and methods, are disclosed herein. A transistor is referred to as "angled" if a longitudinal axis of an elongated semiconductor structure (e.g., a fin or a nanoribbon) based on which the transistor is built is at an angle other than 0 degrees or 90 degrees with respect to the edges of front or back faces of a support structure or a die on/in which the transistor resides, e.g., at an angle between about 10 and 80 degrees with respect to at least one of such edges. Implementing at least some of the transistors of SRAM cells as angled transistors may provide a promising way to increasing densities of SRAM cells on the limited real estate of semiconductor chips.

20 Claims, 20 Drawing Sheets

(56) References Cited

U.S. PATENT DOCUMENTS

| | | | | |
|---|---|---|---|---|
| 5,515,311 | A | 5/1996 | Mihara | |
| 5,600,587 | A | 2/1997 | Koike | |
| 5,889,329 | A | 3/1999 | Rostoker et al. | |
| 6,867,460 | B1 | 3/2005 | Anderson et al. | |
| 7,414,877 | B2 | 8/2008 | Burnett et al. | |
| 9,773,728 | B1 | 9/2017 | Juengling | |
| 2003/0102518 | A1 | 6/2003 | Fried et al. | |
| 2004/0051143 | A1 | 3/2004 | Oh et al. | |
| 2005/0199913 | A1 | 9/2005 | Hofmann et al. | |
| 2005/0262293 | A1 | 11/2005 | Yoon | |
| 2006/0268597 | A1 | 11/2006 | Sakuma | |
| 2008/0037311 | A1* | 2/2008 | Tanaka | H10B 10/12 365/72 |
| 2008/0048226 | A1 | 2/2008 | Heo et al. | |
| 2008/0121956 | A1 | 5/2008 | Kanaya | |
| 2009/0121291 | A1 | 5/2009 | Anderson et al. | |
| 2010/0140710 | A1 | 6/2010 | Kuroda | |
| 2010/0321975 | A1 | 12/2010 | Kimura et al. | |
| 2011/0111568 | A1 | 5/2011 | Kim et al. | |
| 2012/0040528 | A1 | 2/2012 | Kim et al. | |
| 2012/0314476 | A1 | 12/2012 | Appenzeller et al. | |
| 2014/0008728 | A1 | 1/2014 | Kamo | |
| 2016/0027490 | A1 | 1/2016 | Müller | |
| 2016/0055290 | A1 | 2/2016 | Weng | |
| 2018/0061846 | A1 | 3/2018 | Gan | |
| 2018/0182763 | A1 | 6/2018 | Juengling | |
| 2019/0172832 | A1 | 6/2019 | Chang et al. | |
| 2020/0091162 | A1 | 3/2020 | Morris et al. | |
| 2020/0091662 | A1 | 3/2020 | Lee et al. | |
| 2020/0203355 | A1 | 6/2020 | Wu et al. | |
| 2021/0104550 | A1 | 4/2021 | Do | |
| 2021/0367045 | A1 | 11/2021 | Laforet et al. | |
| 2021/0375883 | A1* | 12/2021 | Hsu | H10B 10/12 |
| 2022/0059414 | A1 | 2/2022 | Yang et al. | |
| 2024/0008255 | A1* | 1/2024 | Sharma | H10B 12/315 |
| 2025/0159953 | A1* | 5/2025 | Ghani | H01L 25/0655 |

FOREIGN PATENT DOCUMENTS

| | | | |
|---|---|---|---|
| WO | 2018125024 | A1 | 7/2018 |
| WO | 2019132927 | A1 | 7/2019 |

* cited by examiner 600
400-1
400-2
303-1
303-2
303-3
303-4
302
620
M1
M2
M3
M4
M5
M6
x
y
304-1
304-2
306
316
334-1
324-2

STATIC RANDOM-ACCESS MEMORY DEVICES WITH ANGLED TRANSISTORS

CROSS REFERENCE TO RELATED APPLICATIONS

This application is a continuation of and claims the benefit and priority under 35 U.S.C. 120 from International Application No. PCT/US2022/034565, filed 22 Jun. 2022, entitled "STATIC RANDOM-ACCESS MEMORY DEVICES WITH ANGLED TRANSISTORS," the disclosure of which is considered part of and is incorporated by reference in the disclosure of this application.

BACKGROUND

Integrated circuit (IC) devices with memory circuitry are important to the performance of modern system-on-a-chip (SoC) technology. Static random-access memory (SRAM) is one type of memory, particularly promising for certain applications. An SRAM memory array includes a plurality of memory cells where each memory cell includes a plurality of transistors for storing a bit value or a memory state (e.g., logic "1" or "0") of the cell, and one or more access transistors for controlling access to the cell (e.g., access to write information to the cell or access to read information from the cell). SRAM is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
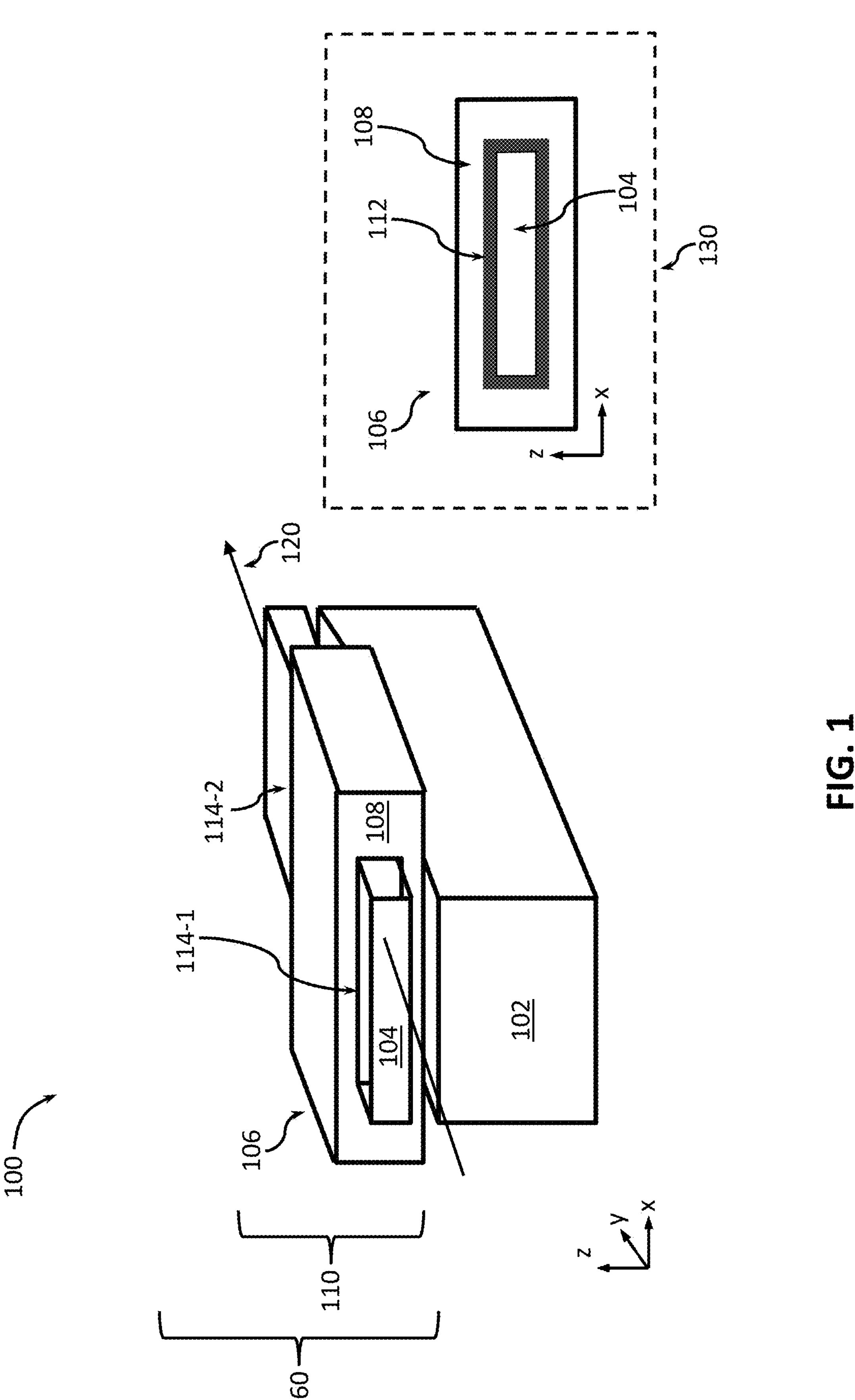
FIG. 1 provides a perspective view of an example IC device implementing a nanoribbon transistor, in accordance with some embodiments.

IC devices implementing one or more SRAM cells with angled transistors, referred to in the following as "SRAM devices with angled transistors," and related assemblies and methods, are disclosed herein. The devices, assemblies, and methods of this disclosure each have several innovative aspects, no single one of which is solely responsible for all the desirable attributes disclosed herein. Details of one or more implementations of the subject matter described in this specification are set forth in the description below and the accompanying drawings.

For purposes of illustrating SRAM devices with angled transistors, proposed herein, it might be useful to first understand phenomena that may come into play in such arrangements. The following foundational information may be viewed as a basis from which the present disclosure may be properly explained. Such information is offered for purposes of explanation only and, accordingly, should not be construed in any way to limit the broad scope of the present disclosure and its potential applications.

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each contact becomes increasingly significant. Careful design of transistors used in SRAM may help with such an optimization for IC devices implementing SRAM.

A typical SRAM cell is made up of six transistors and is, therefore, may be referred to as a "6T SRAM cell," where four transistors are used to store a bit value and two transistors are access transistors, each of the access transistors coupled to control lines of a memory array, e.g., to a bitline (BL) and a wordline (WL). Transistors of SRAM cells are typically implemented as field-effect transistors (FETs), e.g., metal-oxide-semiconductor (MOS) FETs (MOSFETs). A FET is a three-terminal device that includes source, drain, and gate terminals and uses electric field to control current flowing through the device. A FET typically includes a semiconductor channel material, a source region and a drain region provided in the channel material, and a gate stack that includes at least a gate electrode material and, optionally, may also include a gate insulator, where the gate stack is provided over a portion of the channel material between the source region and the drain region.

Recently, FETs with non-planar architectures, such as FinFETs (also sometimes referred to as "wrap around gate transistors" or "tri-gate transistors") and nanoribbon/nanowire transistors (also sometimes referred to as "gate all-around (GAA) transistors"), have been extensively explored as alternatives to transistors with planar architectures.

In a FinFET, an elongated semiconductor structure (e.g., an elongated structure that includes one or more semiconductor materials) shaped as a fin extends away from a base (e.g., from a semiconductor substrate or any suitable support structure). A portion of a fin that is closest to the base may be enclosed by an insulator material. Such an insulator material, typically an oxide, is commonly referred to as a "shallow trench isolation" (STI), and the portion of the fin enclosed by the STI is referred to as a "subfin portion" or simply a "subfin." A gate stack may wrap around an upper portion of the fin (e.g., the portion farthest away from the base). The portion of the fin around which the gate stack wraps is referred to as a "channel region/portion" (or, simply, as a "channel") of a FinFET. A semiconductor material of the channel region is commonly referred to as a "channel material" of the transistor. FinFETs are sometimes referred to as "tri-gate transistors" because, in use, such transistors may form conducting channels on three "sides" of the channel region of the fin. A source region and a drain region may be provided in the fin on the opposite sides of the gate stack, forming, respectively, a source and a drain of a FinFET.

In a nanoribbon transistor, a gate stack may be provided around a portion of an elongated semiconductor structure called "nanoribbon", forming a gate on all sides of the nanoribbon. The "channel" or the "channel region/portion" of a nanoribbon transistor is the portion of the nanoribbon around which the gate stack wraps. Such transistors are sometimes referred to as "GAA transistors" because, in use, such transistors may form conducting channels on all "sides" of the channel region of the nanoribbon. A source region and a drain region are provided in the nanoribbon on each side of the gate stack, forming, respectively, a source and a drain of a nanoribbon transistor. In some settings, the term "nanoribbon" has been used to describe an elongated semiconductor structure that has a substantially rectangular transverse cross-section (e.g., a cross-section in a plane perpendicular to the longitudinal axis of the structure), while the term "nanowire" has been used to describe a similar structure but with a substantially circular or square transverse cross-sections. In the following, a single term "nanoribbon transistor" is used to describe all non-planar transistors where a gate stack wraps around substantially all sides of an elongated semiconductor structure, independent of the shape of the transverse cross-section (e.g., a nanowire or a nanosheet transistor are examples of a nanoribbon transistor). Thus, as used herein, the term "nanoribbon transistor" is used to cover transistors with elongated semiconductor structures that have substantially rectangular transverse cross-sections (possibly with rounded corners), transistors with elongated semiconductor structures that have substantially square transverse cross-sections (possibly with rounded corners), transistors with elongated semiconductor structures that have substantially circular or elliptical/oval transverse cross-sections, as well as transistors with elongated semiconductor structures that have any polygonal transverse cross-sections.

Inventors of the present disclosure realized that using FinFETs and nanoribbon transistors as at least some of the transistors of SRAM cells may be advantageous in some respects but may create challenges for increasing memory density. One challenge resides in that, given a usable surface area of a substrate, there are only so many transistors that can be formed in that area, placing a significant limitation on the density of SRAM cells incorporating such transistors. In conventional solutions, attempts to increase SRAM density have included decreasing the critical dimensions of the memory cells, which requires ever-increasing process complexity and cost, resulting in diminishing returns and expected slow pace of memory scaling for future nodes. Embodiments of the present disclosure may help increase SRAM density by using angled transistors to generate novel SRAM designs using fewer masks and at a lower cost.

As the foregoing illustrates, both FinFETs and nanoribbon transistors are built based on elongated semiconductor structures (in the following referred to, simply, as "elongated structures"), e.g., fins or nanoribbons, respectively. A longitudinal axis of such an elongated structure may be defined as an axis that includes a line along the direction of carrier transport between source and drain regions of the transistor. Typically, such an axis is substantially parallel to the support structure on/in which a transistor resides and is one of lines of symmetry for the elongated structure of the transistor (at least for the idealized version of the transistor that does not reflect unintended manufacturing variations that may affect the real-life geometry of the transistor). Conventionally, FinFETs and nanoribbon transistors are oriented on a support structure so that the direction of their carrier transport (which direction may be represented by the longitudinal axes of their elongated structures), is parallel to the front and back faces/planes of the support structure and is either perpendicular or parallel to different edges of the support structure, in particular, being either perpendicular or parallel to different edges of the front face or the back face of the support structure. The gates of such transistors are then oriented so that an angle between a projection of a gate of a given transistor onto a plane of the support structure and a projection of the longitudinal axis of an elongated structure onto said plane is 90 degrees (e.g., the gates extend in directions perpendicular to longitudinal axes of elongated structures).

In contrast to the conventional implementations described above, embodiments of the present disclosure provide SRAM devices where at least some of the transistors of SRAM cells are angled transistors. As used herein, a transistor is referred to as an "angled transistor" if the direction of carrier transport of the transistor is neither perpendicular nor parallel to any edges of the front face or the back face of a support structure (e.g., a die) over which the transistor is implemented. For example, a transistor may be described as an "angled transistor" if an angle between a projection of the elongated structure of the transistor onto a plane of the support structure and one or more of the edges of the support structure is neither 0 degrees, no 90 degrees, e.g., between about 10 degrees and 80 degrees. Since, in geometry, not just one but two angles may be defined among any two lines crossing one another, the two angles adding together to be 180 degrees, for the angled structures/transistors of SRAM devices described herein, "angles" referred to herein refer to the smaller of the two angles for any given pair of two lines. When a transistor of an SRAM cell is implemented as an angled transistor, the gate of the transistor may still be aligned with the edges of the support structure (e.g., be either perpendicular or parallel to the support structure), which means that the gate is non-angled with respect to the edges of the support structure but is angled with respect to the direction of carrier transport of the transistor. Alternatively, the gate of the transistor may also be angled with respect to the edges of the support structure, as long as it remains angled (e.g., not perpendicular) with respect to the direction of carrier transport of the transistor.

Embodiments of the present disclosure are based on recognition that implementing at least some of the transistors of an SRAM cell as angled transistors with gates that are angled with respect to the direction of carrier transport of the transistors, means that, for a given width of an elongated structure of the transistor, the effective cross-section over which the carriers may be transported between source and drain is increased (e.g., the cross-section of the gates in the x-z plane of the example coordinate system illustrated in the present drawings), advantageously resulting in an increased drive current. Conversely, implementing at least some of the transistors of an SRAM cell as angled transistors with gates that are angled with respect to the direction of carrier transport of the transistors may advantageously allow reducing the widths of the elongated structures of the transistors, thus reducing the footprints of transistors, while keeping the drive current substantially matched to what it would have been without angling. Consequently, implementing at least some of the transistors of SRAM cells as angled transistors may provide a promising way to increasing densities of SRAM cells on the limited real estate of semiconductor chips. In some implementations, SRAM devices with angled transistors may allow significantly increasing density of SRAM cells in a memory array having a given footprint area (the footprint area being defined as an area in a plane of the substrate, or a plane parallel to the plane of the substrate, e.g., the x-y plane of an example coordinate system shown in the drawings of the present disclosure), or, conversely, allow significantly reducing the footprint area of a memory array with a given density of SRAM cells.

Embodiments of the present disclosure are further based on recognition that SRAM devices with angled transistors may be optimized even further if transistors are to be operated at relatively low temperatures, where, as used herein, low-temperature operation (or "lower-temperature" operation) refers to operation at temperatures below room temperature, e.g., below 200 Kelvin degrees or lower. Thermal energy is much lower at low temperatures and, consequently, the off-current (Ioff) of a transistor is much lower and the subthreshold swing is much sharper, compared to room temperature operation. Consequently, if a transistor is operated at low temperatures, its gate length can be shorter than what can be achieved at room temperatures, while keeping the short-channel effects at a level that does not significantly compromise transistor performance. As a result, at low temperatures, it may be possible to further decrease footprints of the angled transistors described herein, thereby decreasing their effective gate lengths, while still maintaining adequate performance. Although in the following, descriptions are provided with respect to FinFETs and nanoribbon transistors, embodiments of the present disclosure, in particular various embodiments of SRAM devices with angled transistors, are applicable to transistors of other architectures, such as planar transistors.

In the following detailed description, various aspects of the illustrative implementations may be described using terms commonly employed by those skilled in the art to convey the substance of their work to others skilled in the art. For example, in context of source/drain (S/D) regions, the term "region" may be used interchangeably with the terms "contact" and "terminal" of a transistor. In another example, as used herein, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," "sulfide," etc. refer to compounds containing, respectively, oxygen, carbon, nitrogen, sulfur, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−10%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−10% of a target value, e.g., within +/−5% or within +/−2% of a target value, based on the context of a particular value as described herein or as known in the art.

The term "interconnect" may refer to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias. The term "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

The terms "over," "under," "between," and "on" as used herein refer to a relative spatial position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, analogous elements designated in the present drawings with different reference numerals after a dash, e.g., edges 303-1, 303-2, 303-3, and 303-4 may be collectively referred to together without the reference numerals after the dash, e.g., as "edges 303." To not clutter the drawings, if multiple instances of certain elements are illustrated, only some of the elements may be labeled with a reference sign. A plurality of drawings with the same number and different letters may be referred to without the letters, e.g., FIGS. 3A-3B may be referred to as "FIG. 3."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of SRAM devices with angled transistors as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various SRAM devices with angled transistors as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 provides a perspective view of an example IC device 100 implementing a nanoribbon transistor 110, in accordance with some embodiments. The nanoribbon transistor 110 is one example of a transistor that may be implemented as an angled transistor with a gate angled with respect to the direction of carrier transport in the transistor as described herein. In turn, such an angled transistor may be included in various IC devices and assemblies described herein, e.g., the nanoribbon transistor 110 implemented as an angled transistor may be one of the transistors of any of the SRAM cells described herein. Because FIG. 1 is provided to assist explanations of what, in general, a nanoribbon transistor is, it does not illustrate a longitudinal axis of the nanoribbon transistor 110 as being angled with respect to the gate of the nanoribbon transistor 110. Rather, FIG. 1 shows a conventional gate that is not angled with respect to the direction of carrier transport of the transistor, and it is the subsequent drawings (e.g., FIG. 3 and FIGS. 5-11) that illustrate example implementations of angled transistors.

Turning to the details of FIG. 1, the IC device 100 may include a semiconductor material, which may include one or more semiconductor materials, formed as a nanoribbon 104

(e.g., a first example of an elongated structure) extending substantially parallel to a support structure 102. The transistor 110 may be formed on the basis of the nanoribbon 104 by having a gate stack 106 at least partially wrap around a portion of the nanoribbon referred to as a "channel region" and by having source and drain regions, shown in FIG. 1 as a first S/D region 114-1 and a second S/D region 114-2, on either side of the gate stack 106. In some embodiments, a layer of oxide material (not specifically shown in FIG. 1) may be provided between the support structure 102 and the gate stack 106.

The IC device 100 shown in FIG. 1, as well as IC devices shown in other drawings of the present disclosure, are intended to show relative arrangements of some of the components therein, and these IC devices, or portions thereof, may include other components that are not illustrated. For example, although not specifically illustrated in FIG. 1, a dielectric spacer may be provided between a first S/D contact (not shown in FIG. 1) that may be coupled to a first S/D region 114-1 of the transistor 110 and the gate stack 106 as well as between a second S/D contact (also not shown in FIG. 1) that may be coupled to a second S/D region 114-2 of the transistor 110 and the gate stack 106 in order to provide electrical isolation between the source, gate, and drain contacts (in general, such contacts may also be referred to as "electrodes"). In another example, although not specifically illustrated in FIG. 1, at least portions of the transistor 110 may be surrounded in an insulator material, such as any suitable interlayer dielectric (ILD) material. In some embodiments, such an insulator material may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In other embodiments, the insulator material surrounding portions of the transistor 110 may be a low-k dielectric material. Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. Similar considerations are applicable to other IC devices shown in the present drawings, e.g., those shown in FIGS. 2-3 and FIGS. 5-11.

Implementations of the present disclosure may be formed or carried out on any suitable support structure 102, such as a substrate, a die, a wafer, or a chip. The support structure 102 may, e.g., be the wafer 2000 of FIG. 12, discussed below, and may be, or be included in, a die, e.g., the singulated die 2002 of FIG. 12, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (e.g., materials from groups III and V of the periodic system of elements), group II-VI (e.g., materials from groups II and IV of the periodic system of elements), or group IV materials (e.g., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device with angled transistors as described herein may be built falls within the spirit and scope of the present disclosure. As used herein, the term "support structure" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure 102 may provide material "support" in that, e.g., the IC devices/structures are build based on the semiconductor materials of the support structure 102. However, in some embodiments, the support structure 102 may provide mechanical support.

The nanoribbon 104 may take the form of a nanowire or nanoribbon, for example. In some embodiments, an area of a transverse cross-section of the nanoribbon 104 (e.g., an area in the x-z plane of the example coordinate system x-y-z shown in FIG. 1) may be between about 25 and 10000 square nanometers, including all values and ranges therein (e.g., between about 25 and 1000 square nanometers, or between about 25 and 500 square nanometers). The transverse cross-section of the nanoribbon 104 is cross-section along a plane perpendicular to a longitudinal axis 120 of the nanoribbon 104, where the longitudinal axis 120 may, e.g., be along the y-axis of the example coordinate system shown in FIG. 1. In some embodiments, a width of the nanoribbon 104 (e.g., a dimension measured in a plane parallel to the support structure 102 and in a direction perpendicular to the longitudinal axis 120, e.g., along the x-axis of the example coordinate system shown FIG. 1) may be at least about 3 times larger than a thickness (or a "height") of the nanoribbon 104 (e.g., a dimension measured in a plane perpendicular to the support structure 102, e.g., along the z-axis of the example coordinate system shown in FIG. 1), including all values and ranges therein, e.g., at least about 4 times larger, or at least about 5 times larger. It should be noted that FIG. 1 illustrates the x-y-z coordinate system being aligned so that the longitudinal axis 120 is along the y-axis only for the ease of explanations of this particular drawing. In other drawings, angled transistors are explained with reference to their longitudinal axes being somewhere in the x-y plane but not aligned with either y-axis or x-axis because the edges of the support structure are assumed to be aligned with those axes and the transistors are angled, meaning that they are at an angle between about 10 degrees and 80 degrees with respect to y-axis and/or x-axis. Thus, when the transistor 110 is an angled transistor of any of the subsequent drawings, the longitudinal axis 120 is not aligned with the y-axis as shown in FIG. 1 but at an angle between 10 degrees and 80 degrees with respect to y-axis.

Although the nanoribbon 104 illustrated in FIG. 1 is shown as having a rectangular cross-section, the nanoribbon 104 may instead have a cross-section that is rounded at corners or otherwise irregularly shaped, and the gate stack 106 may conform to the shape of the nanoribbon 104. The terms "front face" and "back face" of a nanoribbon may refer to the faces of the nanoribbon 104 that are substantially parallel to the support structure 102, the term "sidewall" (or "side face") of a nanoribbon may refer to the opposing faces of the nanoribbon 104 that are substantially perpendicular to the support structure 102 and extend in a direction of the longitudinal axis 120 of the nanoribbon 104, while the term "end" of a nanoribbon may refer to the opposing faces of the nanoribbon 104 that are substantially perpendicular to the longitudinal axis 120 of the nanoribbon 104.

The nanoribbon 104 may be formed of one or more semiconductor materials, together referred to as a "channel material." In general, channel materials of any of the angled transistors described herein, e.g., the channel material of the transistor 110, may be composed of semiconductor material systems including, for example, N-type or P-type materials systems. In some embodiments, the channel material may include a substantially monocrystalline semiconductor, such as silicon (Si) or germanium (Ge). In some embodiments, the channel material may include a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a combination of semiconductor materials.

For some example N-type transistor embodiments (e.g., for the embodiments where the transistor in which the channel material is included is an N-type metal-oxide-semiconductor (NMOS) transistor), the channel material may include a III-V material having a relatively high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$). As fin embodiments, In content (x) may be between 0.6 and 0.9, and may advantageously be at least 0.7 (e.g., $In_{0.7}Ga_{0.3}As$). For some example P-type transistor embodiments (e.g., for the embodiments where the transistor in which the channel material is included is a P-type metal-oxide-semiconductor (PMOS) transistor), the channel material may advantageously be a group IV material having a high hole mobility, such as, but not limited to Ge or a Ge-rich SiGe alloy. For some example embodiments, the channel material may have a Ge content between 0.6 and 0.9, and advantageously may be at least 0.7.

In some embodiments, the channel material may be a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors. IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

In some embodiments, any of the angled transistors described herein, e.g., the transistor 110, may be a thin-film transistor (TFT). A TFT is a special kind of a FET made by depositing active semiconductor material over a support (e.g., a support structure as described above) that may be a non-conducting support. Some such materials may be deposited at relatively low temperatures, which allows depositing them within the thermal budgets imposed on back-end fabrication to avoid damaging the front-end components such as the logic devices of an IC device in which the transistor may be included. Thus, in some embodiments, the channel material of any of the angled transistors described herein, e.g., the transistor 110, may be a semiconductor material deposited at relatively low temperatures, and may include any of the oxide semiconductor materials described above.

In other embodiments, instead of being deposited at relatively low temperatures as described above with reference to the TFTs, the channel material of any of the angled transistors described herein, e.g., the transistor 110, may be epitaxially grown in what typically involves relatively high-temperature processing. In such embodiments, the channel material may include any of the semiconductor materials described above, including oxide semiconductor materials. In some such embodiments, the channel material may be epitaxially grown directly on a semiconductor layer of a support structure over which the transistor will be fabricated, in a process known as "monolithic integration." In other such embodiments, the channel material of any of the angled transistors described herein, e.g., the transistor 110, may be epitaxially grown on a semiconductor layer of another support structure and then the epitaxially grown layer of the channel material may be transferred, in a process known as a "layer transfer," to a support structure over which the transistor will reside, in which case the latter support structure may but does not have to include a semiconductor layer prior to the layer transfer. Layer transfer advantageously allows forming transistors, such as FinFETs or nanoribbon transistors, over support structures or in layers that do not include semiconductor materials (e.g., in the back end of an IC device). Layer transfer also advantageously allows forming transistors of any architecture (e.g., non-planar or planar transistors) without imposing the negative effects of the relatively high-temperature epitaxial growth process on devices that may already be present over a support structure.

A channel material that is deposited at relatively low temperatures is typically a polycrystalline, polymorphous, or amorphous semiconductor, or any combination thereof. A channel material that is epitaxially grown is typically a highly crystalline (e.g., monocrystalline or single-crystalline) material. Therefore, whether the channel material of any of the transistors described herein, is deposited at relatively low temperatures or epitaxially grown can be identified by inspecting grain size of the active portions of the channel material (e.g., of the portions of the channel material that form channels of transistors). An average grain size of a channel material of a transistor being between about 0.5 and 1 millimeters (in which case the material may be polycrystalline) or smaller than about 0.5 millimeter (in which case the material may be polymorphous or amorphous) may be indicative of the channel material having been deposited (e.g., if the transistor in which such a channel material is included is a TFT). On the other hand, an average grain size of a channel material of a transistor being equal to or greater than about 1 millimeter (in which case the material may be a single-crystal material) may be indicative of the channel material having been epitaxially grown and included in the final device either by monolithic integration or by layer transfer.

In some embodiments, the channel material of any of the angled transistors described herein, e.g., the transistor 110, may include a two-dimensional (2D) semiconductor material, e.g., a semiconductor material with a thickness of a few nanometers or less, where electrons in the material are free to move in the 2D plane but their restricted motion in the third direction is governed by quantum mechanics. In some such embodiments, such a channel material may include a single atomic monolayer of a 2D semiconductor material, while, in other such embodiments, such a channel material may include five or more atomic monolayers of a 2D semiconductor material. Examples of 2D materials that may be used to implement the channel material of any of the angled transistors described herein include, but are not limited to, graphene, hexagonal boron nitride, or transition-metal chalcogenides.

A gate stack 106 including a gate electrode material 108 and, optionally, a gate insulator 112, may wrap entirely or almost entirely around a portion of the nanoribbon 104 as shown in FIG. 1, with the channel region of the transistor 110 being the active region (channel region) of the channel material in the portion of the nanoribbon 104 wrapped by the gate stack 106. The gate insulator 112 is not shown in the perspective drawing of the IC device 100 shown in FIG. 1 but is shown in an inset 130 of FIG. 1, providing a cross-sectional side view of a portion of the nanoribbon 104 with a gate stack 106 wrapping around it. As shown in FIG. 1, the gate insulator 112 may wrap around a transversal portion/cross-section of the nanoribbon 104, and the gate electrode material 108 may wrap around the gate insulator 112.

The gate electrode material 108 may include at least one P-type work function metal or N-type work function metal, depending on whether the transistor 110 is a PMOS transistor or an NMOS transistor. P-type work function metal may be used as the gate electrode material 108 when the transistor 110 is a PMOS transistor and N-type work function metal may be used as the gate electrode material 108 when the transistor 110 is an NMOS transistor. For a PMOS transistor, metals that may be used for the gate electrode material 108 may include, but are not limited to, ruthenium, palladium, platinum, cobalt, nickel, and conductive metal oxides (e.g., ruthenium oxide). For an NMOS transistor, metals that may be used for the gate electrode material 108 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 108 may include a stack of two or more metal layers, where one or more metal layers are work function metal layers and at least one metal layer is a fill metal layer. Further layers may be included next to the gate electrode material 108 for other purposes, such as to act as a diffusion barrier layer or/and an adhesion layer.

In some embodiments, the gate insulator 112 may include one or more high-k dielectrics including any of the materials discussed herein with reference to the insulator material that may surround portions of the transistor 110. In some embodiments, an annealing process may be carried out on the gate insulator 112 during manufacture of the transistor 110 to improve the quality of the gate insulator 112. The gate insulator 112 may have a thickness that may, in some embodiments, be between about 0.5 nanometers and 3 nanometers, including all values and ranges therein (e.g., between about 1 and 3 nanometers, or between about 1 and 2 nanometers), although, in other embodiments, the thickness of the gate insulator 112 may be greater than 3 nanometers. In some embodiments, the gate stack 106 may be surrounded by a gate spacer, not shown in FIG. 1. Such a gate spacer would be configured to provide separation between the gate stack 106 and source/drain contacts of the transistor 110 and could be made of a low-k dielectric material, some examples of which have been provided above. A gate spacer may include pores or air gaps to further reduce its dielectric constant.

In some embodiments, the gate insulator 112 may include a hysteretic material or a hysteretic arrangement, which, together, may be referred to as a "hysteretic element." Transistors 110 in which the gate insulator 124 includes a hysteretic element may be described as "hysteretic transistors" and may be used to implement hysteretic memory. Hysteretic memory refers to a memory technology employing hysteretic materials or arrangements, where a material or an arrangement may be described as hysteretic if it exhibits the dependence of its state on the history of the material (e.g., on a previous state of the material). Ferroelectric (FE) and antiferroelectric (AFE) materials are examples of hysteretic materials. Layers of different materials arranged in a stack to exhibit charge-trapping phenomena is an example of a hysteretic arrangement.

A FE or an AFE material is a material that exhibits, over some range of temperatures, spontaneous electric polarization, e.g., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (e.g., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. Because the current state of the electric dipoles in FE and AFE materials depends on the previous state, such materials are hysteretic materials. Memory technology where logic states are stored in terms of the orientation of electric dipoles in (e.g., in terms of polarization of) FE or AFE materials is referred to as "FE memory," where the term "ferroelectric" is said to be adopted to convey the similarity of FE memories to ferromagnetic memories, even though there is typically no iron (Fe) present in FE or AFE materials.

A stack of alternating layers of materials that is configured to exhibit charge-trapping is an example of a hysteretic arrangement. Such a stack may include as little as two layers of materials, one of which is a charge-trapping layer (e.g., a layer of a material configured to trap charges when a voltage is applied across the material) and the other one of which is a tunneling layer (e.g., a layer of a material through which the charge is to be tunneled to the charge-trapping layer). The tunneling layer may include an insulator material such as a material that includes silicon and oxygen (e.g., silicon oxide), or any other suitable insulator. The charge-trapping layer may include a metal or a semiconductor material that is configured to trap charges. Because the trapped charges may be kept in a charge-trapping arrangement for some time even in the absence of an electric field, such arrangements may be used to implement memory cells. Because the presence and/or the number of trapped charges in a charge-trapping arrangement depends on the previous state, such arrangements are hysteretic arrangements. Memory technology where logic states are stored in terms of the amount of charge trapped in a hysteretic arrangement may be referred to as "charge-trapping memory."

Hysteretic memories have the potential for adequate non-volatility, short programming time, low power consumption, high endurance, and high-speed writing. In addition, hysteretic memories may be manufactured using processes compatible with the standard complementary metal-oxide-semiconductor (CMOS) technology. Therefore, over the last few years, these types of memories have emerged as promising candidates for many growing applications.

In some embodiments, the hysteretic element of the gate insulator 112 may be provided as a layer of a FE or an AFE material. Such an FE/AFE material may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides), with various dopants added to ensure sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as the hysteretic element and are within the scope of the present disclosure.

In other embodiments, the hysteretic element of the gate insulator 112 may be provided as a stack of alternating layers of materials that can trap charges. In some such embodiments, the stack may be a two-layer stack, where one layer is a charge-trapping layer and the other layer is a tunneling layer. The tunneling layer may include an insulator material such as a material that includes silicon and oxygen (e.g., silicon oxide), or any other suitable insulator. The charge-trapping layer may include an electrically conductive material such as a metal, or a semiconductor material. In some embodiments, the charge-trapping layer may include a sub-stoichiometric material (e.g., a material that includes less than a stochiometric amount of a reagent). The sub-stoichiometric material may include vacancies in concentration of at least about $10^{18}$ vacancies per cubic centimeter, e.g., in concentration between about $10^{18}$ vacancies per cubic centimeter and about $10^{22}$-$10^{23}$ vacancies per cubic centimeter. As known in the art, vacancies refer to cites where atoms (e.g., oxygen or nitrogen) that should be present are missing, thus providing a defect in a material. For example, the sub-stoichiometric material of any of the hysteretic elements described herein may include oxygen and the vacancies may be oxygen vacancies, or the sub-stoichiometric material may include nitrogen and the vacancies may be nitrogen vacancies. During operation, charges may be trapped in the vacancies of the sub-stoichiometric material. Thus, implementing a sub-stoichiometric material with vacancies is one way to provide a charge-trapping layer of a hysteretic arrangement. In general, any material that has defects that can trap charge may be used in/as a charge-trapping layer. Such defects are very detrimental to operation of logic devices and, therefore, typically, deliberate steps need to be taken to avoid presence of the defects. However, for memory devices, such defects may be desirable because charge-trapping may be used to represent different memory states of a memory cell.

In some embodiments of the hysteretic element being provided as a stack of alternating layers of materials that can trap charges, the stack may be a three-layer stack where an insulator material is provided on both sides of a charge-trapping layer. In such embodiments, a layer of an insulator material on one side of the charge-trapping layer may be referred to as a "tunneling layer" while a layer of an insulator material on the other side of the charge-trapping layer may be referred to as a "field layer."

In various embodiments of the hysteretic element being provided as a stack of alternating layers of materials that can trap charges, a thickness of each layer the stack may be between about 0.5 and 10 nanometers, including all values and ranges therein, e.g., between about 0.5 and 5 nanometers. In some embodiment of a three-layer stack, a thickness of each layer of the insulator material may be about 0.5 nanometers, while a thickness of the charge-trapping layer may be between about 1 and 8 nanometers, e.g., between about 2.5 and 7.5 nanometers, e.g., about 5 nanometers. In some embodiments, a total thickness of the hysteretic element provided as a stack of alternating layers of materials that can trap charges (e.g., a hysteretic arrangement) may be between about 1 and 10 nanometers, e.g., between about 2 and 8 nanometers, e.g., about 6 nanometers.

Turning to the S/D regions 114 of the transistor 110, in some embodiments, the S/D regions may be highly doped, e.g., with dopant concentrations of about $10^{21}$ dopants per cubic centimeter, in order to advantageously form Ohmic contacts with the respective S/D electrodes, although these regions may also have lower dopant concentrations and may form Schottky contacts in some implementations. Irrespective of the exact doping levels, the S/D regions of a transistor may be the regions having dopant concentration higher than in other regions, e.g., higher than a dopant concentration in the channel region (e.g., in a channel material extending between the first S/D region 114-1 and the second S/D region 114-2), and, therefore, may be referred to as "highly doped" (HD) regions. The channel region of the transistor 110 may include semiconductor materials with doping concentrations significantly smaller than those of the S/D regions 114.

The S/D regions 114 of the transistor 110 may generally be formed using either an implantation/diffusion process or an etching/deposition process. In the former process, dopants such as boron, aluminum, antimony, phosphorous, or arsenic may be ion-implanted into the nanoribbon 104 to form the source and drain regions. An annealing process that activates the dopants and causes them to diffuse further into the nanoribbon 104 may follow the ion implantation process. In the latter process, portions of the nanoribbon 104 may first be etched to form recesses at the locations of the future S/D regions 114. An epitaxial deposition process may then be carried out to fill the recesses with material that is used to fabricate the S/D regions 114. In some implementations, the S/D regions 114 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 114 may be formed using one or more alternate semiconductor materials such as germanium or a group III-V material or alloy. And in further embodiments, one or more layers of metal and/or metal alloys may be used to form the S/D regions 114. In some embodiments, a distance between the first and second S/D regions 114 (e.g., a dimension measured along the longitudinal axis 120 of the nanoribbon 104) may be between about 5 and 40 nanometers, including all values and ranges therein (e.g., between about 22 and 35 nanometers, or between about 20 and 30 nanometers).

Figure 2:
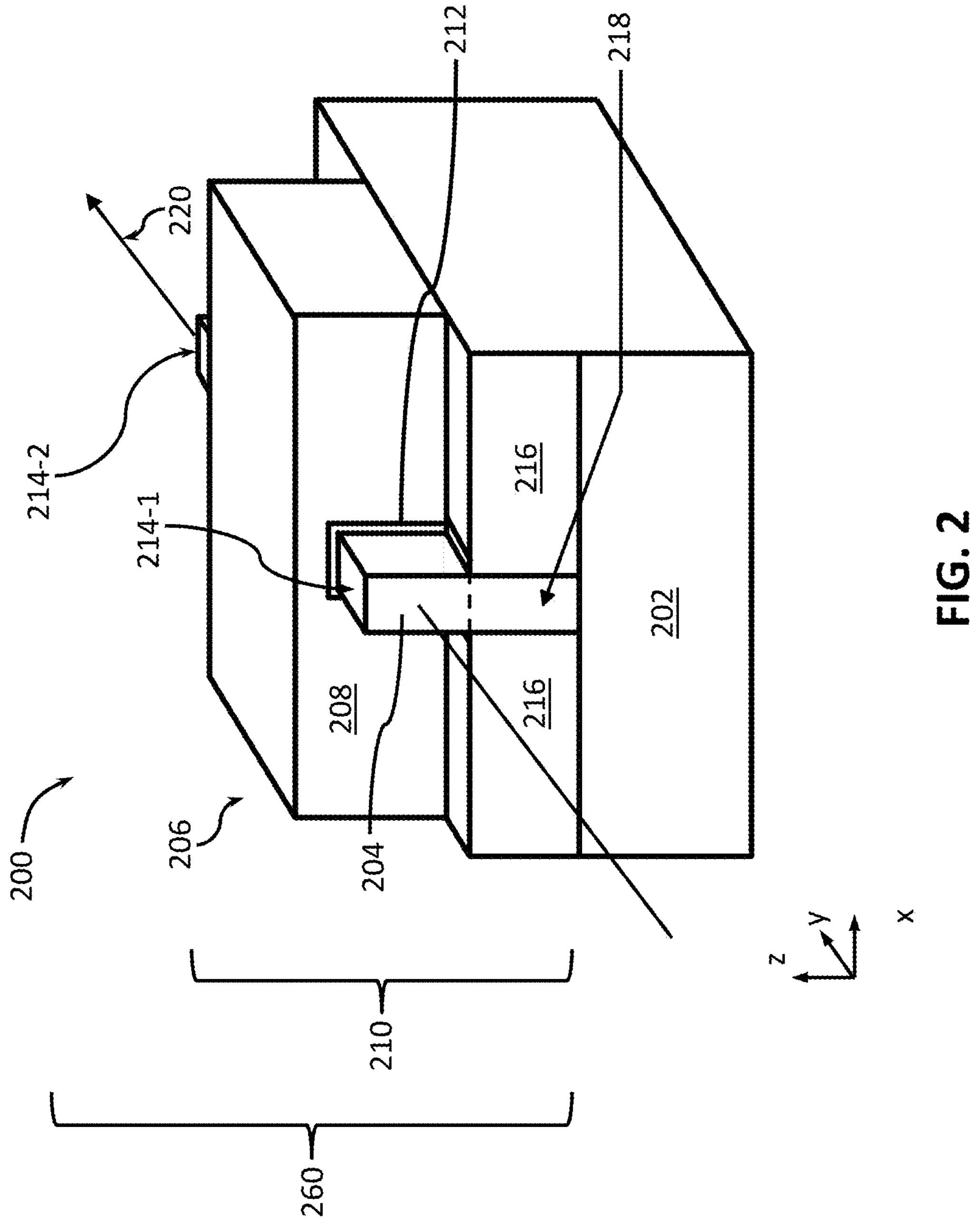
FIG. 2 provides a perspective view of an example IC device implementing a fin-based field-effect transistor (FinFET), in accordance with some embodiments.

FIG. 2 provides a perspective view of an example IC device 200 implementing a FinFET 210, in accordance with some embodiments. The FinFET 210 is another example of an angled transistor that may be included in various IC devices and assemblies described herein, e.g., that may be one of the transistors of an SRAM cell as described herein.

Turning to the details of FIG. 2, the IC device 200 may include a semiconductor material, which may include one or more semiconductor materials, formed as a fin 204 extending away from a support structure 202. A FinFET 210 may be formed on the basis of the fin 204 by having a gate stack 206 at least partially wrap around a channel region of the fin 204 and by having source and drain regions, shown in FIG. 2 as a first S/D region 214-1 and a second S/D region 214-2, on either side of the gate stack 206. As shown in FIG. 2, the gate stack 206 includes a gate electrode material 208 and a gate insulator 212, each of which wraps entirely or almost entirely around the channel region of the fin 204, although in other embodiments of the IC device 200 the gate insulator 212 may be absent. Descriptions provided above with reference to the support structure 102, the gate stack 106, the gate electrode material 108, the gate insulator 112, and the S/D regions 114 are applicable to, respectively, the support structure 202, the gate stack 206, the gate electrode material 208, the gate insulator 212, and the S/D regions 214, and, therefore, in the interests of brevity, are not repeated. FIG. 2 further illustrates an STI 216, enclosing sidewalls of a subfin portion 218 of the fin 204. The STI 216 may include any of the insulator materials described above, e.g., any suitable ILD materials. Descriptions provided above with reference to the channel material of the transistor 110 are applicable to the semiconductor material of at least a channel region of the fin 204 (e.g., of at least a portion of the fin 204 wrapped by the gate stack 206) and, therefore, in the interests of brevity, are not repeated.

A longitudinal axis 220 of the fin 204 may be along the y-axis of the example coordinate system shown in the present drawings. The FinFET 210 may have a gate length (e.g., a distance between the first and second S/D regions 214-1, 214-2), a dimension measured along the longitudinal axis 220, which may, in some embodiments, be between 2 and 60 nanometers, including all values and ranges therein (e.g., between 5 and 20 nanometers, or between 5 and 30 nanometers). Although the fin 204 is illustrated in FIG. 2 as having a rectangular cross-section in the transverse cross-section (e.g., in the x-z plane of FIG. 2), the fin 204 may instead have a cross-section that is rounded or sloped at the "top" of the fin 204, and the gate stack 206 may conform to this rounded or sloped fin 204. In use, the FinFET 210 may form conducting channels on three "sides" of the fin 204, potentially improving performance relative to single-gate transistors (which may form conducting channels on one "side" of a channel material or substrate) and double-gate transistors (which may form conducting channels on two "sides" of a channel material or substrate). It should be noted that, similar to FIG. 1, FIG. 2 illustrates the x-y-z coordinate system being aligned so that the longitudinal axis 220 is along the y-axis only for the ease of explanations of this particular drawing. In other drawings, angled transistors are explained with reference to their longitudinal axes being somewhere in the x-y plane but not aligned with either y-axis or x-axis because the edges of the support structure are assumed to be aligned with those axes and the transistors are angled, meaning that they are at an angle between 10 degrees and 80 degrees with respect to y-axis and/or x-axis. Thus, when the FinFET 210 is an angled transistor of any of the subsequent drawings, the longitudinal axis 220 is not aligned with the y-axis as shown in FIG. 2 but at an angle between about 10 degrees and 80 degrees with respect to y-axis.

Either the nanoribbon 104 or the fin 204 may be an elongated structure based on which any of the angled transistors of the SRAM devices described herein may be built. In other words, any of the angled transistors may be implemented, e.g., as the transistor 110 but with the nanoribbon 104 being angled or as the FinFET 210 but with the fin 204 being angled.

Figures 3A, 3B:
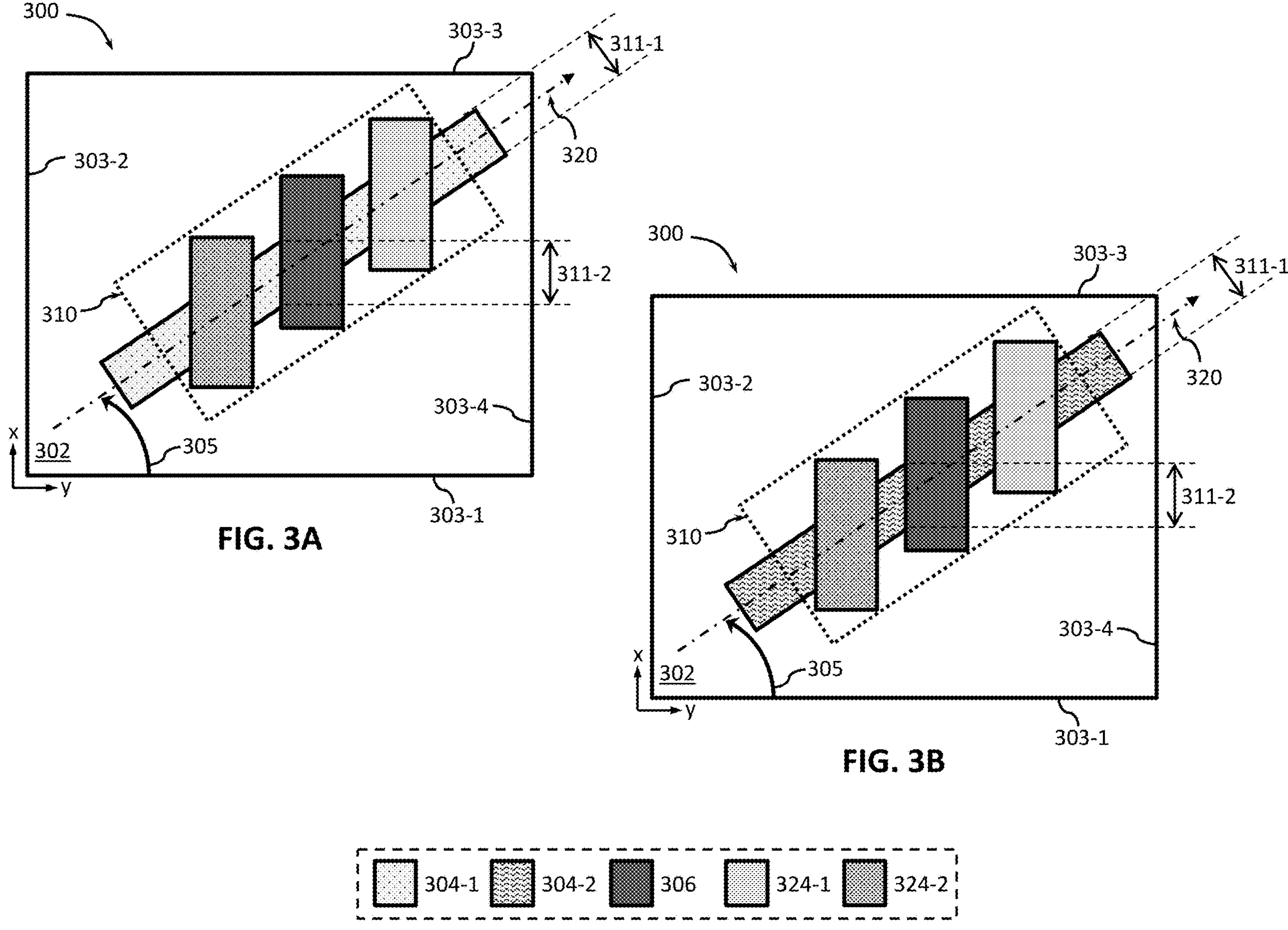
FIGS. 3A-3B provide top-down views of example IC devices with, respectively, N-type and P-type angled transistors that may be used in an SRAM cell, in accordance with some embodiments.

FIGS. 3A-3B provide top-down views (e.g., x-y plane views of the example coordinate system shown in the present drawings) of example IC devices 300 with, respectively, N-type and P-type angled transistors that may be used to implement some or all of the transistors of an SRAM cell, in accordance with some embodiments. A number of elements labeled in FIGS. 3A-3B, as well in some of the subsequent drawings (e.g., FIGS. 5-11) with reference numerals that are indicated in these drawings with different patterns in order to not clutter the drawings with too many reference numerals, with a legend showing the correspondence between the reference numerals and patterns being provided within a dashed box at the bottom of these drawings. For example, the legend illustrates that FIGS. 3A-3B and FIGS. 5-11 use different patterns to show N-type elongated structures 304-1 (e.g., elongated structures where the semiconductor material of the channel regions of transistors is an N-type semiconductor material), P-type elongated structures 304-2 (e.g., elongated structures where the semiconductor material of the channel regions of transistors is a P-type semiconductor material), gates 306, etc.

The top-down views of the IC devices 300 shown in FIGS. 3A-3B are intended to show relative arrangements of some of the components therein, and the IC devices 300, or portions thereof, may include other components that are not illustrated. For example, although not specifically illustrated in FIGS. 3A-3B, the IC devices 300 may include multiple transistors implemented in, or based on, the elongated structures 304, and/or may include gate spacers as known in the art. In another example, although not specifically illustrated in FIGS. 3A-3B, at least portions of the elongated structures 304 may be surrounded in an insulator material, such as any of the ILD materials described above.

As shown in FIGS. 3A-3B, the IC device 300 may include a support structure 302, which may include four edges 303, individually shown as an edge 303-1, 303-2, 303-3, and 303-4. The edges 303 may be edges of either the front face of the support structure 302 or the back face of the support structure 302, depending on whether the elongated structures 304 are provided on the front face or the back face of the support structure 302. The support structure 302 may be any of the support structures 102/202, described herein. The support structure 302 is, typically, rectangular and, therefore, adjacent ones of the edges 303 are at 90 degrees with respect to one another. For example, the edges 303-1 and 303-2 are adjacent and at 90 degrees with respect to one another, the edges 303-2 and 303-3 are adjacent and at 90 degrees with respect to one another, and so on.

As shown in FIGS. 3A-3B, one or more elongated structures 304 may be provided over the support structure 302. Any of the elongated structures 304 may be the nanoribbon 104 or the fin 204, described herein. Only one elongated structure 304 is shown in each of FIGS. 3A-3B to illustrate, in FIG. 3A, that the transistor 310 may be an NMOS transistor when the elongated structure 304 is an N-type elongated structure 304-1, and to illustrate, in FIG. 3B, that the transistor 310 may be a PMOS transistor when the elongated structure 304 is a P-type elongated structure 304-2. However, in other embodiments, the IC device 300 may include a plurality of such elongated structures 304 and, as typical for CMOS applications, the IC device 300 may include both NMOS and PMOS transistors 310. Examples of such IC devices are illustrated in FIGS. 5-11, described below.

The elongated structures 304 shown in FIGS. 3A-3B are "angled" because their longitudinal axes 320 (shown in FIGS. 3A-3B as dash-dotted arrows and being analogous to the longitudinal axes 120, 220, described above) are not at angles of either 0 degrees or 90 degrees with respect to all edges 303 of the support structure 302. As shown in these drawings, the longitudinal axis 320 may be at an angle 305 with respect to the y-axis of the example coordinate system shown, where the angle 305 may be between about 10 and 80 degrees. Thus, the transistors 310 (the approximate outlines of which are shown in FIGS. 3A-3B to be within dotted contours) are angled transistors. The transistors 310 may be implemented as, e.g., the nanoribbon transistors 110 or the FinFETs 210, described above.

FIGS. 3A-3B and the analogous subsequent drawings that show the top-down views of the IC structures with angled transistors illustrate the gates 306 as non-angled gates. For example, in FIGS. 3A-3B and FIGS. 5-11, the gates 306 are at an angle of 90 degrees with respect to each of the edges 303-1 and 303-3 and are at an angle of 0 degrees with respect to each of the edges 303-2 and 303-4. As a result, the gates 306 are angled with respect to the direction of carrier transport of the transistors 310, as defined by the angled longitudinal axes 320. In other embodiments of the IC devices described herein, the gates 306 may be angled with respect to the edges 303, as long as they remain to be angled with respect to the direction of carrier transport of the transistors 310. Any of the gates 306 may be, or include, any of the gate stacks 106/206, described herein.

FIGS. 3A-3B further illustrate that the transistor 310 may include first and second S/D contacts 324-1, 324-2. The first S/D contact 324-1 may be an electrical contact to the first S/D region of the transistor 310 (e.g., the first S/D region 114-1 or 214-1 of, respectively, FIG. 1 or 2), while the second S/D contact 324-2 may be an electrical contact to the second S/D region of the transistor 310 (e.g., the second S/D region 114-2 or 214-2 of, respectively, FIG. 1 or 2), and may include any suitable electrically conductive material, as known in the art. In particular, FIGS. 3A-3B illustrate an embodiment where the first and second S/D contacts 324-1, 324-2 may also be non-angled, e.g., may be at the same angle with respect to the edges 303 as the gate 306, although, in other embodiments of the IC devices described herein, the S/D contacts 324 may be angled. Irrespective of whether the S/D contacts 324 are angled, arranging the longitudinal axis 320 of the transistor 310 at an angle with respect to the gate 306 (e.g., arranging the longitudinal axis 320 so that it is not perpendicular to the gate 306) ensures that the cross-section for carrier transport between the first and second S/D regions of the transistor 310 is larger compared to what it would have been for a given width of the elongated structure 304 that is not angled with respect (e.g., is perpendicular) to the gate 306, advantageously resulting in an increased drive current for the transistor 310. In particular, if the elongated structure 304 of the transistor 310 was perpendicular to the gate 306, as is done in conventional implementations, then the cross-section for carrier transport between the first and second S/D regions of the transistor 310 would be a cross-section in a plane perpendicular to the x-y plane of the example coordinate system shown in FIGS. 3A-3B with the dimension in the x-y plane being a dimension 311-1 (e.g., the width of the elongated structure 304). However, when the elongated structure 304 and the gate 306 are angled with respect to one another, e.g., as shown in FIGS. 3A-3B, then the cross-section for carrier transport between the first and second S/D regions of the transistor 310 is a cross-section in a plane perpendicular to the x-y plane of the example coordinate system shown in FIGS. 3A-3B with the dimension in the x-y plane being a dimension 311-2 (e.g., the dimension along the x-axis of the example coordinate system shown). The dimension 311-2 is larger than the dimension 311-1 because the dimension 311-2 is the hypotenuse of a triangle in which the dimension 311-1 is a side of the triangle. Because for these two scenarios the dimension along the z-axis is the same (as defined by the height of the elongated structure 304 in the z-axis direction), increasing the dimension in the x-y plane leads to an increased cross-section and, thus, to an increased drive current for a given width of the elongated structure 304.

A plurality of transistors 310 may be formed along any and each of the angled elongated structures 304 of an IC device 300, thus forming angled transistors as described herein. Any of the transistors 310 may be implemented as the transistors 110 and/or the FinFETs 210, but with the gates 306 being angled with respect to the longitudinal axes 320 of the transistors. Any one or more, or any combination of logic, memory, radio frequency (RF), and analog circuits may then be implemented with such transistors 310. In particular, the transistors 310 may be used to implement SRAM cells as described herein.

Figure 4:
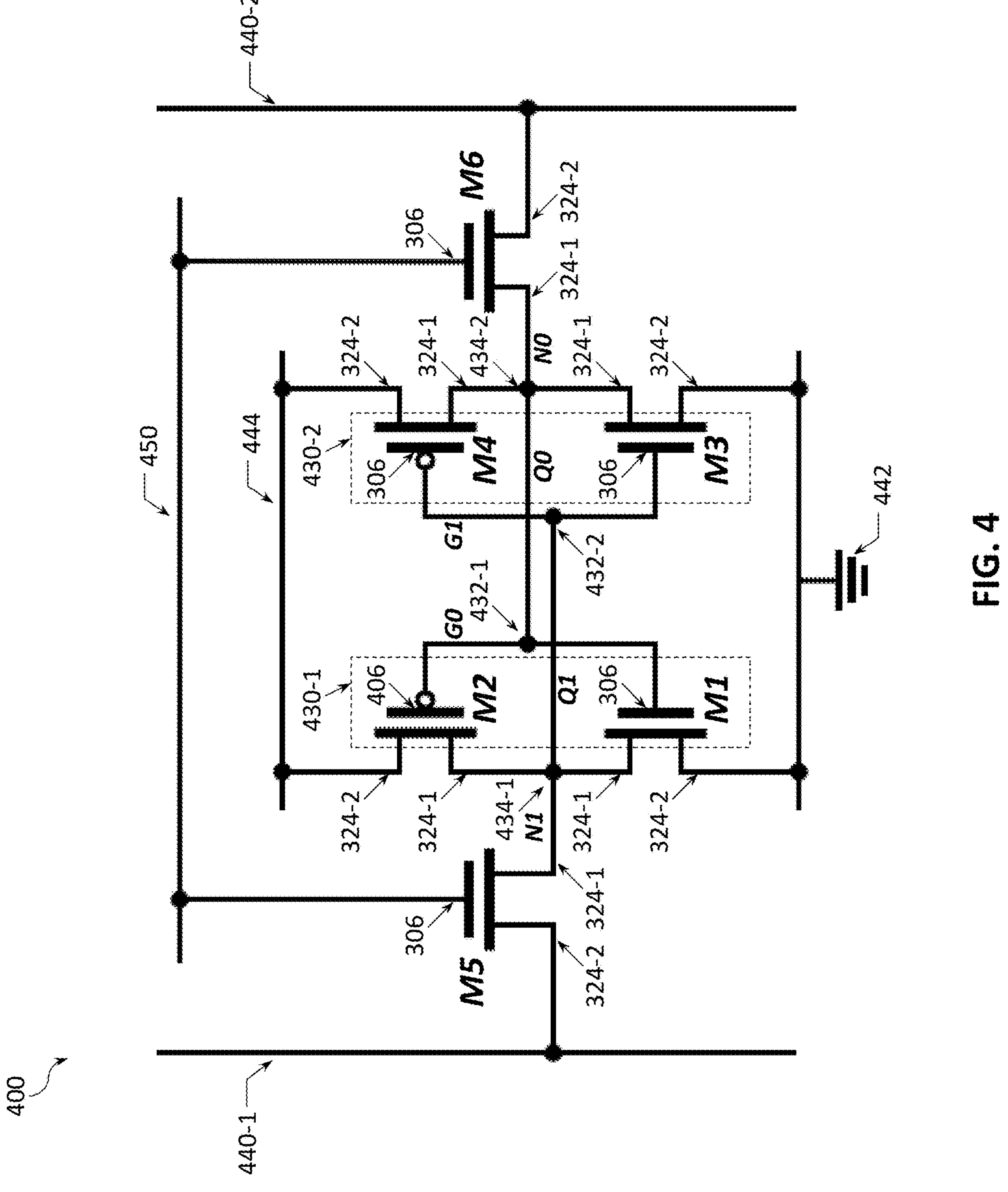
FIG. 4 provides an electric circuit diagram of an example SRAM cell, in accordance with some embodiments.

FIG. 4 provides an electric circuit diagram of an example 6T SRAM memory cell 400, according to some embodiments of the present disclosure.

As shown in FIG. 4, the SRAM cell 400 may include transistors M1-M4 for storing a bit value or a memory state (e.g., logic "1" or "0") of the cell, and two access transistors, M5 and M6, for controlling access to the cell (e.g., access to write information to the cell or access to read information from the cell 400). Each of the transistors M1-M6 may be implemented as an angled transistor as described herein. For example, each of the transistors M1, M3, M5 and M6 is an NMOS transistor and, therefore, may be implemented as the transistor 310 shown in FIG. 3A. Similarly, each of the transistors M2 and M4 is a PMOS transistor and, therefore, may be implemented as the transistor 310 shown in FIG. 3B. To illustrate that the transistors M1-M6 may be implemented as respective transistors 310 of FIGS. 3A-3B, the reference numerals for various elements of the transistors 310 shown in FIGS. 3A-3B are used in FIG. 4 to label analogous elements of the transistors M1-M6. Thus, FIG. 4 illustrates the gates 306 and the first and second S/D contacts 324-1 and 324-2 for each of the transistors M1-M6.

In the SRAM cell 400, each bit may be stored on four transistors (M1, M2, M3, M4) that form two cross-coupled inverters 430, each having an input 432 and an output 434. The first inverter 430-1 may be formed by an NMOS transistor M1 and a PMOS transistor M2, while the second inverter 430-2 may be formed by an NMOS transistor M3 and a PMOS transistor M4. As shown in FIG. 4, the gate 306 of the transistor M1 may be coupled to (e.g., directly connected to) the gate 306 of the transistor M2 (where the point of such coupling may be referred to as a node G0, labeled in FIG. 4), and both of these gates 306 may be coupled to the input 432-1 of the first inverter 430-1. Furthermore, the first S/D contact 324-1 of the transistor M1 may be coupled to the first S/D contact 324-1 of the transistor M2 (where the point of such coupling may be referred to as a node N1, labeled in FIG. 4), and both first S/D contacts 324-1 may be coupled to the output 434-1 of the first inverter 430-1. Similarly, for the second inverter 430-2, the gate 306 of the transistor M3 may be coupled to the gate 306 of the transistor M4 (where the point of such coupling may be referred to as a node G1, labeled in FIG. 4), and both of these gate stacks may be coupled to the input 432-2 of the second inverter 430-2, while the first S/D contact 324-1 of the transistor M3 may be coupled to the first S/D contact 324-1 of the transistor M4 (where the point of such coupling may be referred to as a node N0, labeled in FIG. 4), and both of these first S/D contacts 324-1 may be coupled to the output 434-2 of the second inverter 430-2. As also shown in FIG. 4, when the transistors M1 and M3 are NMOS transistors and when the transistors M2 and M4 are PMOS transistors as illustrated in FIG. 4, the second S/D contacts 324-2 of the transistors M1 and M3 may be coupled to a ground voltage 442, while the second S/D contacts 324-2 of the transistors M2 and M4 may be coupled to a supply voltage 444, e.g., VDD. In the embodiments of the SRAM cell 400 where the NMOS transistors shown in FIG. 4 are replaced with PMOS transistors and where the PMOS transistors shown in FIG. 4 are replaced with NMOS transistors, the designation of the ground voltage 442 and the supply voltage 444 would be reversed, all of which embodiments being within the scope of the present disclosure.

The four transistors M1-M4 in such configuration form a stable storage cell for storing a bit value of 0 or 1. As further shown in FIG. 4, two additional access transistors, M5 an M6, may serve to control the access to the storage cell of the transistors M1-M4 during read and write operations. As shown in FIG. 4, the first S/D contact 324-1 of the access transistor M5 may be coupled to the output 434-1 of the first inverter 430-1. Phrased differently, the first S/D contact 324-1 of the access transistor M5 may be coupled to (e.g., directly connected to) each of the first S/D contact 324-1 of the transistor M1 and the first S/D contact 324-1 of the transistor M2, where the node N1 shown in FIG. 4 is the point of such coupling. The second S/D contact 324-2 of the access transistor M5 may be coupled to a first BL 440-1. Thus, each of the first S/D contact 324-1 of the transistor M1 and the first S/D contact 324-1 of the transistor M2 may be coupled to the first BL 440-1 (e.g., via the access transistor M5). The gate 306 of the access transistor M5 may be coupled to a WL 450. As further shown in FIG. 4, the first S/D contact 324-1 of the access transistor M6 may be coupled to the output 434-2 of the second inverter 430-2. Phrased differently, the first S/D contact 324-1 of the access transistor M6 may be coupled to (e.g., directly connected to) each of the first S/D contact 324-1 of the transistor M3 and the first S/D contact 324-1 of the transistor M4, where the node N0 shown in FIG. 4 is the point of such coupling. The second S/D contact 324-2 of the access transistor M6 may be coupled to a second BL 440-2. Thus, each of the first S/D contact 324-1 of the transistor M3 and the first S/D contact 324-1 of the transistor M4 may be coupled to the second BL 440-2 (e.g., via the access transistor M6). The gate 306 of the access transistor M6 may be coupled to the WL 450. Thus, the gates 306 of both of the access transistors M5 and M6 may be coupled to a single, shared, WL, the WL 450. As also shown in FIG. 4, the input 432-1 of the first inverter 430-1 (e.g., the node G0) may be coupled to (e.g., directly connected to) the first S/D contact 324-1 of the access transistor M6 (e.g., the node N0), via an interconnect Q0, labeled in FIG. 4. Similarly, FIG. 4 illustrates that the input 432-2 of the second inverter 430-2 (e.g., the node G1) may be coupled to (e.g., directly connected to) the first S/D contact 324-1 of the access transistor M5 (e.g., the node N1), via an interconnect Q1, labeled in FIG. 4. In other words, each of the gate 306 of the transistor M1 and the gate 306 of the transistor M2 may be coupled to the first S/D contact 324-1 of the access transistor M6, while each of the gate 306 of the transistor M3 and the gate 306 of the transistor M4 may be coupled to the first S/D contact 324-1 of the access transistor M5. Phrased differently, each of the gate 306 of the transistor M1 and the gate 306 of the transistor M2 may be coupled to the second BL 440-2 (e.g., via the access transistor M6), while each of the gate 306 of the transistor M3 and the gate 306 of the transistor M4 may be coupled to the first BL 440-1 (e.g., via the access transistor M5).

The WL 450 and the first and second BLs 440 may be used together to read and program (e.g., write to) the SRAM cell 400. In particular, access to the cell may be enabled by the WL 450 which controls whether the two access transistors M5 and M6 are on or off. In turn, the access transistors M5 and M6 control whether the SRAM cell 400 is connected to the BLs 440-1 and 440-2. During operation of the SRAM cell 400, a signal on the first BL 440-1 may be complementary to a signal on the second BL 440-2 (e.g., then the signal on the first BL 440-1 is HIGH or logic "1" the signal on the second BL 440-2 may be LOW or "logic 0," and vice versa). The two BLs 440 may be used to transfer data for both read and write operations of the SRAM cell 400. In other embodiments of the SRAM cell 400, only a single BL 440 may be used, instead of two bitlines 440-1 and 440-2, although having one signal BL and one inverse or complementary BL, such as the two BLs 440 shown in FIG. 4, may help improve noise margins.

During read accesses, the BLs 440 may be actively driven HIGH and LOW by the inverters 430 in the SRAM cell 400. This may improve SRAM bandwidth compared to dynamic random-access memory (DRAM). The symmetric structure of the SRAMs cell 400 also allows for differential signaling, which may provide an improvement in detecting small voltage swings. Another difference with DRAM that may contribute to making SRAM faster than DRAM is that commercial chips accept all address bits at a time. By comparison, commodity DRAMs may have the address multiplexed in two halves, e.g., higher bits followed by lower bits, over the same package pins to keep their size and cost down.

Each of the WL 450 and the BLs 440, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as copper, ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

Figure 5:
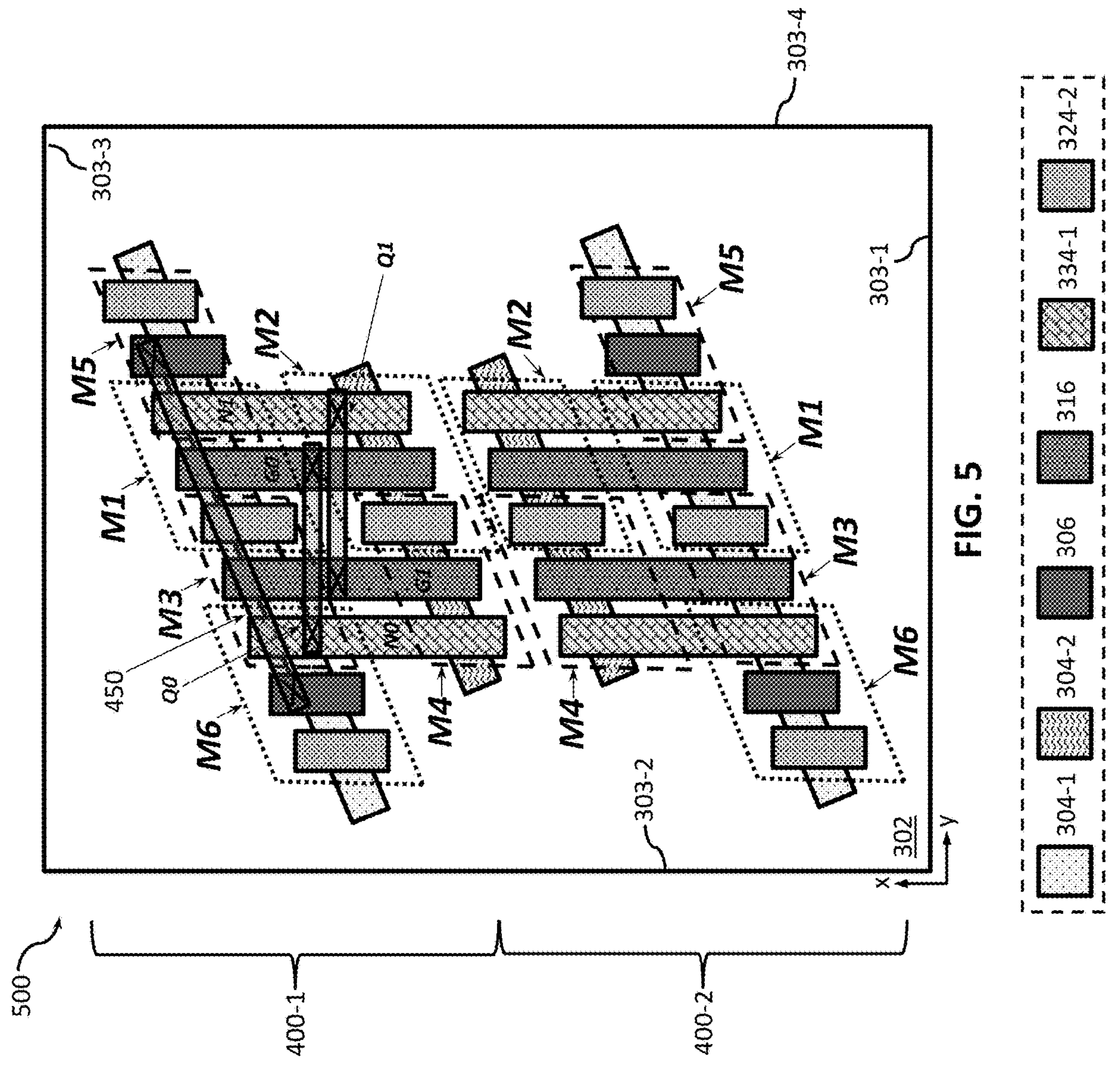
FIG. 5 provides a top-down view of a first example IC device with two SRAM cells with angled transistors, in accordance with some embodiments.
Figure 6:
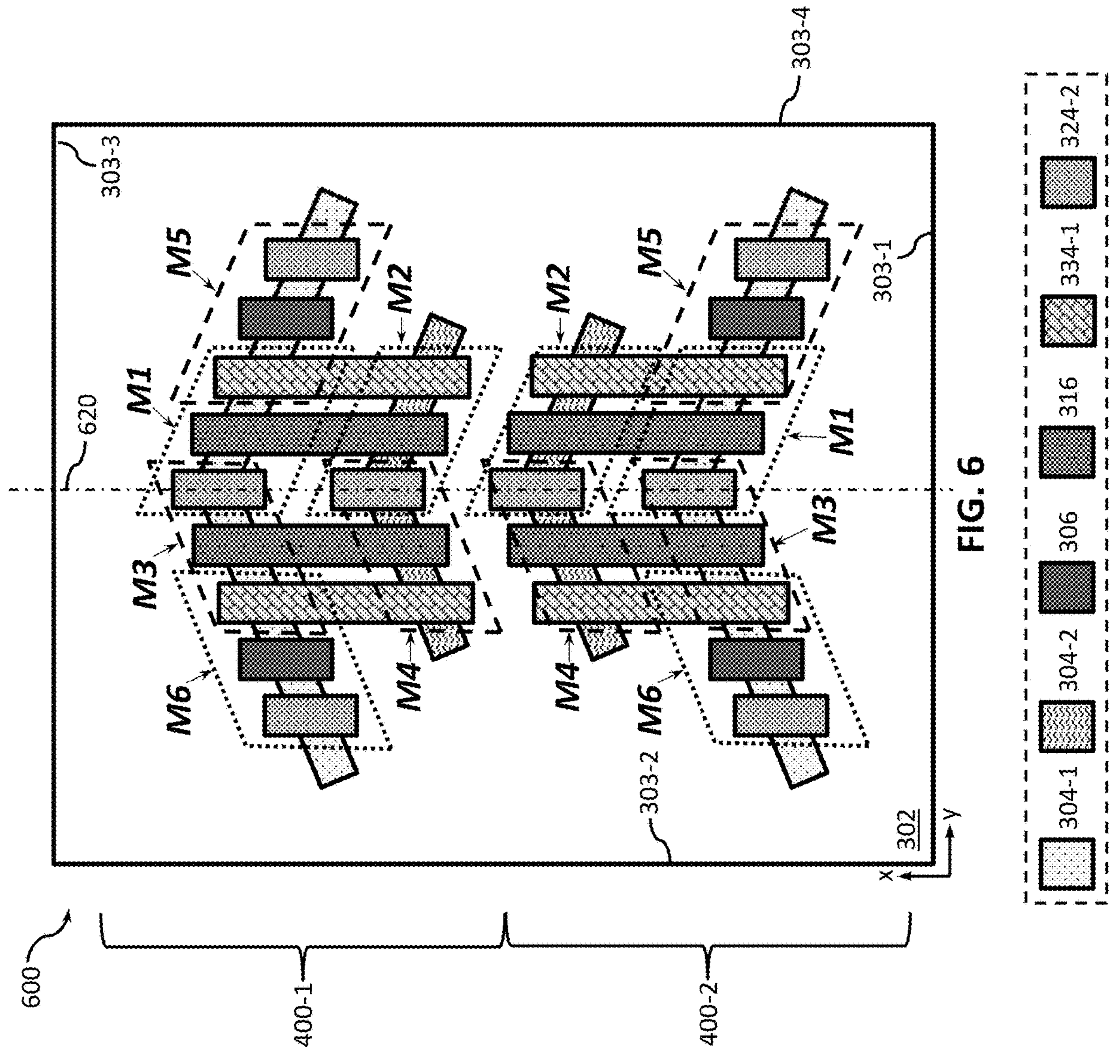
FIG. 6 provides a top-down view of a second example IC device with two SRAM cells with angled transistors, in accordance with some embodiments.
Figure 7:
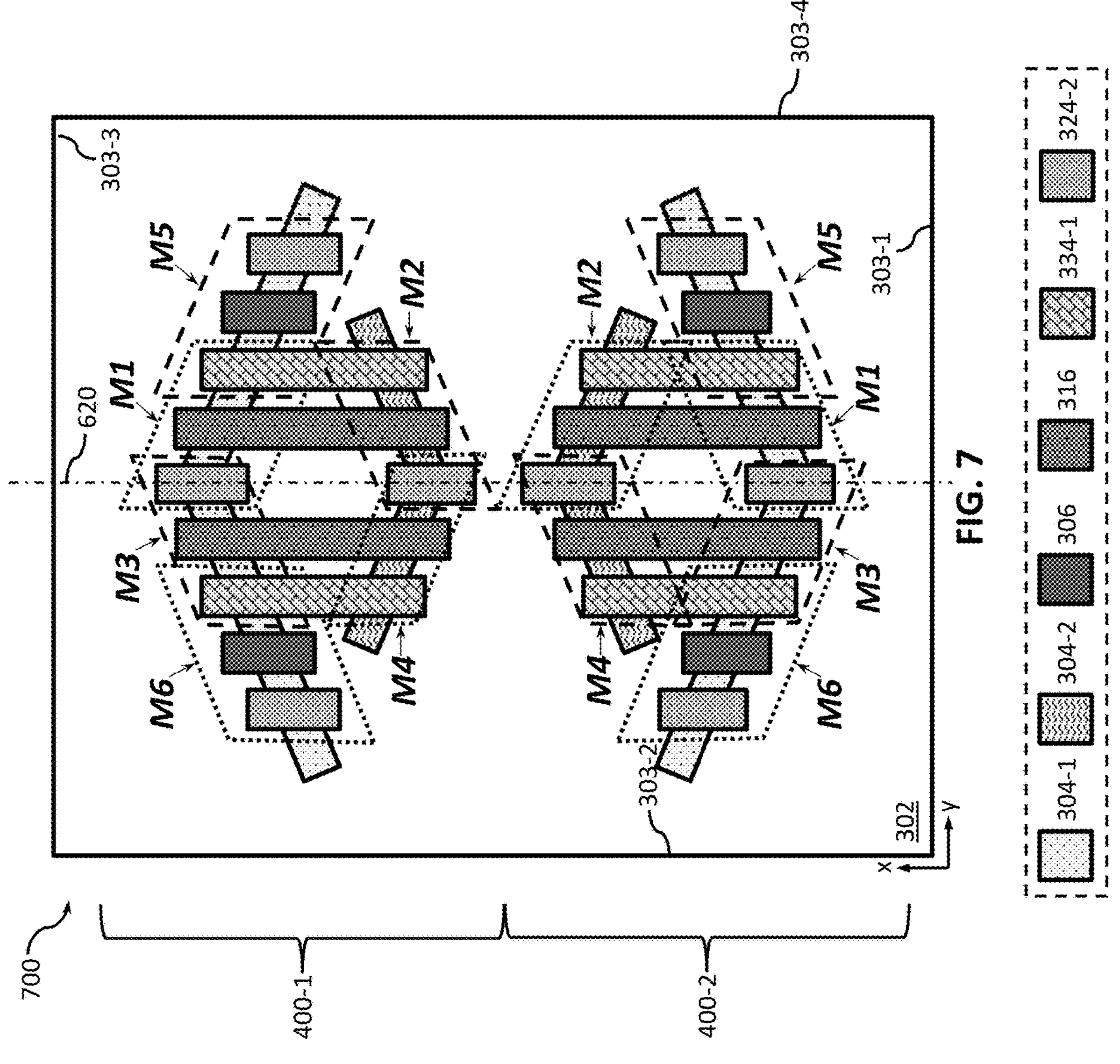
FIG. 7 provides a top-down view of a third example IC device with two SRAM cells with angled transistors, in accordance with some embodiments.

FIGS. 5-7 illustrate different examples of physical layouts of the transistors M1-M6 of the SRAM cell 400 of FIG. 4, where the NMOS transistors M1, M3, M5, and M6 are provided along the N-type elongated structures 304-1 and where the PMOS transistors M2 and M4 are provided along the P-type elongated structures 304-2. In particular, each of FIGS. 5-7 illustrates a top-down cross-sectional view (e.g., an x-y plane view of the example coordinate system shown in the present drawings) of an example IC device with two such SRAM cells 400, labeled as SRAM cells 400-1 and 400-2.

In a first example, FIG. 5 illustrates an IC device 500 with two SRAM cells 400 with angled transistors M1-M6 arranged along four parallel elongated structures 304, in accordance with some embodiments. In the IC device 500, transistors M6, M3, M1, and M5 of the SRAM cell 400-1 are arranged along a first instance of the N-type elongated structure 304-1 (the one shown at the top of the drawing), transistors M6, M3, M1, and M5 of the SRAM cell 400-2 are arranged along a second instance of the N-type elongated structure 304-1 (the one shown at the bottom of the drawing), transistors M4 and M2 of the SRAM cell 400-1 are arranged along a first instance of the P-type elongated structure 304-2 (the one shown right below the first instance of the N-type elongated structure 304-1), and transistors M4 and M2 of the SRAM cell 400-2 are arranged along a second instance of the P-type elongated structure 304-2 (the one shown right below the first instance of the P-type elongated structure 304-2).

For each of the SRAM cells 400 of the IC device 500, various terminals of the transistors M1-M6 are coupled to one another as described above with reference to FIG. 4. In particular, coupling between some pairs of the terminals of the transistors M1-M6 are realized by using shared terminals. Some examples of this will now be described with reference to the SRAM cell 400-1 of the IC device 500, but analogous descriptions are applicable to the SRAM cell 400-2 as well. For example, FIG. 5 illustrates that the gate 306 of the transistors M3 and M4 of the SRAM cell 400-1 are coupled to (e.g., directly connected to) one another by virtue of a first instance of a gate line 316 that extends across the elongated structures 304-1 and 304-2 of the SRAM cell 400-1 (e.g., is electrically and/or physically continuous across multiple elongated structures 304 in the IC device 500). Such a single first gate line 316 may be electrically and physically continuous between the transistors M3 and M4 of the SRAM cell 400-1 and have a first portion that forms, or is electrically coupled to (e.g., directly connected to), the gate 306 of the transistor M3 and have a second that forms, or is electrically coupled to (e.g., directly connected to), the gate 306 of the transistor M4 of the SRAM cell 400-1. Thus, the gate line 316 shared between the transistors M3 and M4 of the SRAM cell 400-1 may be a first shared gate terminal of this cell. Similarly, the gates 306 of the transistors M1 and M2 of the SRAM cell 400-1 are coupled to (e.g., directly connected to) one another, as is shown in FIG. 5 with a second instance of the gate line 316 extending across the elongated structures 304-1 and 304-2 of the SRAM cell 400-1 (e.g., being electrically and/or physically continuous across multiple elongated structures 304 in the IC device 500). Such a single second gate line 316 may be electrically and physically continuous between the transistors M1 and M2 of the SRAM cell 400-1 and have a first portion that forms, or is electrically coupled to (e.g., directly connected to), the gate 306 of the transistor M1 and have a second that forms, or is electrically coupled to (e.g., directly connected to), the gate 306 of the transistor M2 of the SRAM cell 400-1. Thus, the gate line 316 shared between the transistors M1 and M2 of the SRAM cell 400-1 may be a second shared gate terminal of this cell. On the other hand, the gates 306 of the transistors M5 and M6 are not shared with any other transistors of the SRAM cell 400-1, as is shown in FIG. 5 with individual instances of the gates 306 of these transistors.

Other examples of shared terminals of the SRAM cell 400-1 of the IC device 500 are shared S/D terminals. In particular, FIG. 5 illustrates that the SRAM cell 400-1 may have two instances of contact lines 334-1 that extend across the elongated structures 304-1 and 304-2 of the SRAM cell 400-1 (e.g., these contact lines 334-1 are electrically and/or physically continuous across multiple elongated structures 304 in the IC device 500). The first instance of such a contact line 334-1 couples the first S/D contacts 324-1 of the transistors M6 and M4 of the SRAM cell 400-1, where a first portion of the first contact line 334-1 forms or is electrically coupled to (e.g., directly connected to) the first S/D contact 324-1 of the transistor M6 and a second portion of the first contact line 334-1 forms or is electrically coupled to (e.g., directly connected to) the first S/D contact 324-1 of the transistor M4. FIG. 5 further illustrates that the first portion of the first contact line 334-1 of the SRAM cell 400-1 is shared between the transistors M6 and M3, e.g., the first portion of the first contact line 334-1 forms or is electrically coupled to (e.g., directly connected to) the first S/D contact 324-1 of the transistor M6 and, simultaneously, the first S/D contact 324-1 of the transistor M3. Thus, the contact line 334-1 shared between the transistors M6, M4, and M3 of the SRAM cell 400-1 may be a first shared S/D terminal of this cell. The second instance of such a contact line 334-1 couples the first S/D contacts 324-1 of the transistors M5 and M2 of the SRAM cell 400-1, where a first portion of the second contact line 334-1 forms or is electrically coupled to (e.g., directly connected to) the first S/D contact 324-1 of the transistor M5 and a second portion of the second contact line 334-1 forms or is electrically coupled to (e.g., directly connected to) the first S/D contact 324-1 of the transistor M2. FIG. 5 further illustrates that the first portion of the second contact line 334-1 of the SRAM cell 400-1 is shared between the transistors M5 and M1, e.g., the first portion of the second contact line 334-1 forms or is electrically coupled to (e.g., directly connected to) the first S/D contact 324-1 of the transistor M5 and, simultaneously, the first S/D contact 324-1 of the transistor M1. Thus, the contact line 334-1 shared between the transistors M5, M2, and M1 of the SRAM cell 400-1 may be a second shared S/D terminal of this cell. FIG. 5 further shows that the second S/D contacts 324-2 of some of the transistors of the SRAM cell 400-1 may be shared but without extending across multiple elongated structures 304. For example, as shown in FIG. 5, the transistors M1 and M3 may share a single second S/D contact 324-2, and, similarly, the transistors M2 and M4 may share a single second S/D contact 324-2. On the other hand, the second S/D contacts 324-2 of the transistors M5 and M6 are not shared with any other transistors of the SRAM cell 400-1, as is shown in FIG. 5 with individual instances of the second S/D contacts 324-2 of these transistors.

FIG. 5 further illustrates an outline of the WL 450 that may be coupled to the SRAM cell 400-1 as described above. As shown in FIG. 5, such a WL may be arranged as an angled WL, with an angle similar to that of the elongated structures 304. Such an arrangement may be particularly beneficial in terms of efficient coupling of the WL 450 to the gate terminals of the transistors M6 and M5 of the SRAM cell 400-1. Although not specifically shown for the SRAM cell 400-2 of FIG. 5, or for the SRAM cells 400 shown in FIGS. 6 and 7, the WLs 450 coupled to these SRAM cells may be angled in a similar manner.

FIG. 5 also provides labels for the nodes N0, N1, G1, and G1, described with reference to FIG. 4, and illustrates the interconnects Q0 and Q1 between respective ones of these nodes, for the SRAM cell 400-1. Electrical connections of each of the interconnects Q0 and Q1 to respective ones of the nodes N0, N1, G0, and G1 are shown in FIG. 5 with crosses in areas where the interconnects Q0 and Q1 overlap the respective nodes N0, N1, G0, and G1. For example, FIG. 5 illustrates that the interconnect Q0 of the SRAM cell 400-1 may provide coupling between the contact line 334-1 shared between the transistors M6, M3, and M4 (e.g., the node N0) and the gate line 316 shared between the transistors M1 and M2 (e.g., the node G0) of the SRAM cell 400-1. Similarly, the interconnect Q1 of the SRAM cell 400-1 may provide coupling between the contact line 334-1 shared between the transistors M5, M1, and M2 (e.g., the node N1) and the gate line 316 shared between the transistors M3 and M4 (e.g., the node G1) of the SRAM cell 400-1. In some embodiments, the interconnects Q0 and Q1 may be non-angled, e.g., be substantially aligned with the edges 303-1, 303-3, as shown in FIG. 5. Although not specifically shown for the SRAM cell 400-2 of FIG. 5, or for the SRAM cells 400 shown in FIGS. 6 and 7, the interconnects Q0 and Q1 coupled to these SRAM cells may be aligned in a similar manner.

In the IC device 500, the four instances of the elongated structures 304 of the IC device 500 are parallel to one another, which means that the angles between different ones of the elongated structures 304 of the IC device 500 and a given edge 303 of the support structure 302 are all the same (e.g., the angles with respect to the edge 303-1 may all be equal to the angle 305, described above). One advantage of such a topology may be easier fabrication, compared to more complicated topologies shown in FIG. 6 and FIG. 7.

In a second example, FIG. 6 illustrates an IC device 600 with two SRAM cells 400 with angled transistors M1-M6 arranged along four elongated structures 304 nested with respect to one another, in accordance with some embodiments. For the IC device 600, the arrangement of the individual transistors M1-M6 of each of the SRAM cells 400 along the elongated structures 304-1 and 304-2, and the coupling between various terminals of these transistors is substantially the same as in the IC device 500, described above. What is different is that, while the individual elongated structures 304 of the IC device 500 were substantially straight lines, angled with respect to the edges 303 of the support structure 302, each of the elongated structures 304 of the IC device 600 includes two portions at an angle to one another—the first portion being to the left of a line 620 shown in FIG. 6 and the second portion being to the right of the line 620. For example, looking at the elongated structure 304-1 shown at the top of the IC device 600 of FIG. 6 (e.g., the elongated structure based on which the transistors M6, M3, M1, and M5 of the SRAM cell 400-1 are provided), such an elongated structure includes a first portion the left of the line 620 and a second portion to the right of the line 620. The first portion of the elongated structure 304-1 of the SRAM cell 400-1 is the portion of the elongated structure 304-1 based on which the transistors M6 and M3 of the SRAM cell 400-1 are provided, while the second portion is the portion of the elongated structure 304-1 based on which the transistors M1 and M5 of the SRAM cell 400-1 are provided. Similarly, looking at the elongated structure 304-2 shown right below the elongated structure 304-1 shown at the top of the IC device 600 of FIG. 6 (e.g., the elongated structure based on which the transistors M4 and M2 of the SRAM cell 400-1 are provided), such an elongated structure also includes a first portion the left of the line 620 and a second portion to the right of the line 620. The first portion of the elongated structure 304-2 of the SRAM cell 400-1 is the portion of the elongated structure 304-21 based on which the transistor M4 of the SRAM cell 400-1 is provided, while the second portion is the portion of the elongated structure 304-2 based on which the transistor M2 of the SRAM cell 400-1 is provided. Analogous applies to the first and second portions of the elongated structures 304 of other SRAM cells 400 of the IC device 600, e.g., the SRAM cell 400-2. As shown in FIG. 6, all of the first portions of the elongated structures 304 of the IC device 600 are substantially parallel to one another, and all of the second portions of the elongated structures 304 of the IC device 600 are substantially parallel to one another as well, thus resulting in an arrangement that may be described as "nesting" of the elongated structures 304. In some embodiments, the first portions of the elongated structures 304 of the IC device 600 may be at an angle 305 with respect to the edge 303-1, as described above, while the second portions of the elongated structures 304 of the IC device 600 may be at an angle that is the difference between 180 degrees and the angle 305 with respect to the edge 303-1, if the latter angle is measured counterclockwise from the edge 303-1 (similar to how the angle 305 is measured, as shown in FIG. 3). In other embodiments, angles of the first and second portions with respect to a given edge 303 may be independent of one another, as long as at least one of the first and second portions of a given elongated structure 304 is angled with respect to the edges 303, e.g., is at an angle between about 10 degrees and 80 degrees with respect to one or more edges 303.

In some embodiments, the first and second portions of an individual elongated structure 304 of the IC device 600 may be in contact with one another (e.g., an end of the first portion may be in contact with an end of the second portion). In such embodiments, an individual elongated structure 304 may be seen as a continuous elongated structure that changes a direction in which it extends (e.g., it has a turn or a bend in it). In other embodiments, the point where the first and second portions of an individual elongated structure 304 of the IC device 600 meet may be a shared S/D region/contact. This is shown in FIG. 6 (listed from the top to the bottom of the drawing) with the shared second S/D contact 324-2 of the transistors M3 and M1 provided along, respectively, first and second portions of the elongated structure 304-1 of the SRAM cell 400-1, with the shared second S/D contact 324-2 of the transistors M4 and M2 provided along, respectively, first and second portions of the elongated structure 304-2 of the SRAM cell 400-1, with the shared second S/D contact 324-2 of the transistors M4 and M2 provided along, respectively, first and second portions of the elongated structure 304-2 of the SRAM cell 400-2, and with the shared second S/D contact 324-2 of the transistors M3 and M1 provided along, respectively, first and second portions of the elongated structure 304-1 of the SRAM cell 400-2.

In the IC device 600, all first portions of the elongated structures 304 are parallel to one another (e.g., their longitudinal axes are parallel) and all second portions of the elongated structures 304 are parallel to one another and, therefore, different elongated structures 304 are nested/stacked within one another. In other embodiments, different elongated structures 304 of an SRAM device with angled transistors may still have first and second portions as described with reference to the IC device 600, but the N-type elongated structures 304-1 and the P-type elongated structures 304-2 may be arranged opposite of one another. One example of such an arrangement is shown as an IC device 700 of FIG. 7, providing a third example of an IC device with two SRAM cells 400 with angled transistors M1-M6 arranged along four parallel elongated structures 304 arranged opposite to one another, in accordance with some embodiments.

For the IC device 700, the arrangement of the individual transistors M1-M6 of each of the SRAM cells 400 along the elongated structures 304-1 and 304-2, and the coupling between various terminals of these transistors is substantially the same as in the IC device 500, described above. Furthermore, the distinction between the first and second portions of each of the elongated structures 304 along the line 620, and how the different portions may meet one another at their ends, is substantially the same as in the IC device 600, described above. What is different from the IC device 600 is that, in the IC device 700, the first portions of the N-type elongated structures 304-1 are substantially parallel to the second portions of the P-type elongated structures 304-2, while the second portions of the N-type elongated structures 304-1 are substantially parallel to the first portions of the P-type elongated structures 304-2. In other embodiments of the IC device 700, the first and second portions do not have to be parallel at this manner, but may be at different angles, as long as this kind of opposite stacking arrangement remains.

Implementing SRAM cells based on elongated structures 304 changing direction as described with respect to FIG. 6 and FIG. 7 may provide advantages in terms of improved carrier transport in different structures. For example, for some semiconductor materials, carrier transport of electrons may be optimal in one crystallographic plane, while carrier transport of holes may be optimal in a different crystallographic plane. When the elongated structures 304 are formed of such semiconductor materials and are all angled in the same manner with respect to the edges 303, carrier transport of either electrons or holes may be compromised to the point that it may no longer be neglected. In such implementations, providing individual elongated structures 304 that have portions changing the direction of the orientation with respect to the edges 303, e.g., as shown in FIGS. 6 and 7, may allow achieving a balance between factors such as carrier mobility, complexity of the fabrication process, and overall footprint.

FIG. 5 illustrated how the WL 450 may be aligned with the elongated structures 304 of one of the SRAM cells 400. When multiple such cells are arranged in an array, the BLs 440 may be arranged in different configurations, depending on the topology of the individual SRAM cells 400 as well as on the manner in which multiple SRAM cells 400 are placed in the array. Some examples are illustrated in FIGS. 8-10. Each of FIGS. 8-10 illustrates four or more SRAM cells 400 within an array provided over the support structure 302 (FIG. 10C illustrates five such SRAM cells), where the individual SRAM cells are not labeled with a reference numeral in order to not clutter the drawings, but it is clear where the boundaries of those SRAM cells are by comparing them to those shown in FIGS. 5-7. Each of FIGS. 8-10 further illustrates BLs 440-11, 440-12, 440-21, and 440-22, where the BLs 440-11 and 440-12 are, respectively, first and second instances of the BL 440-1 of FIG. 4, and where the BLs 440-21 and 440-22 are, respectively, first and second instances of the BL 440-2 of FIG. 4. Connections of various BLs 440 shown in FIGS. 8-10 to respective second S/D contacts 324-2 are shown in these drawings with crosses in areas where the BLs 440 overlap the respective second S/D contacts 324-2. Each of FIGS. 8-10 further illustrates the support structure 302, so that the relationships between the arrangements of the arrays of the SRAM cells 400 and the BLs 440 with respect to the edges 303 of the support structure 302 are clear.

Figure 8A:
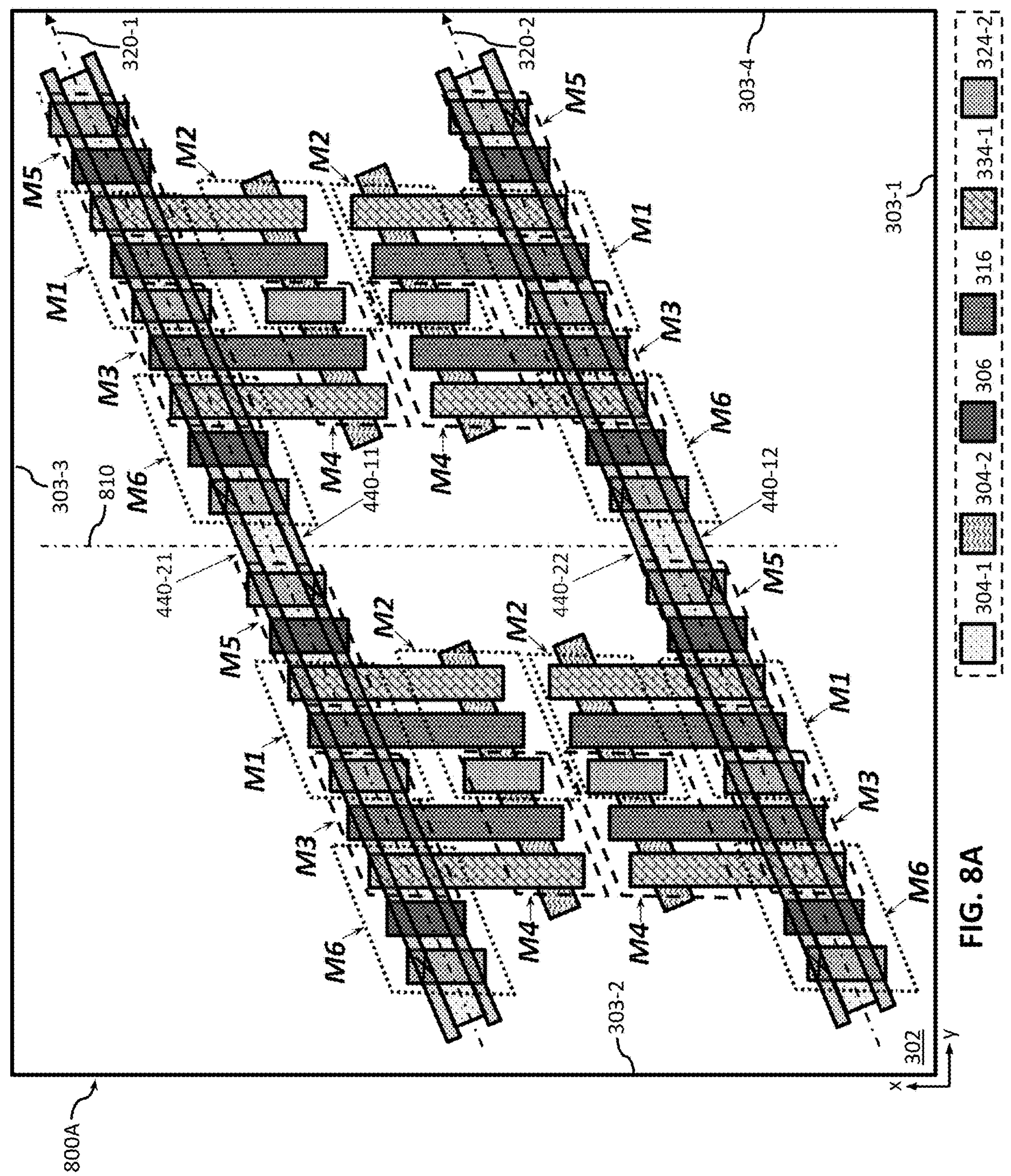
FIGS. 8A-8B provide top-down views of example IC devices implementing arrays of SRAM cells of FIG. 5, in accordance with some embodiments.
Figure 8B:
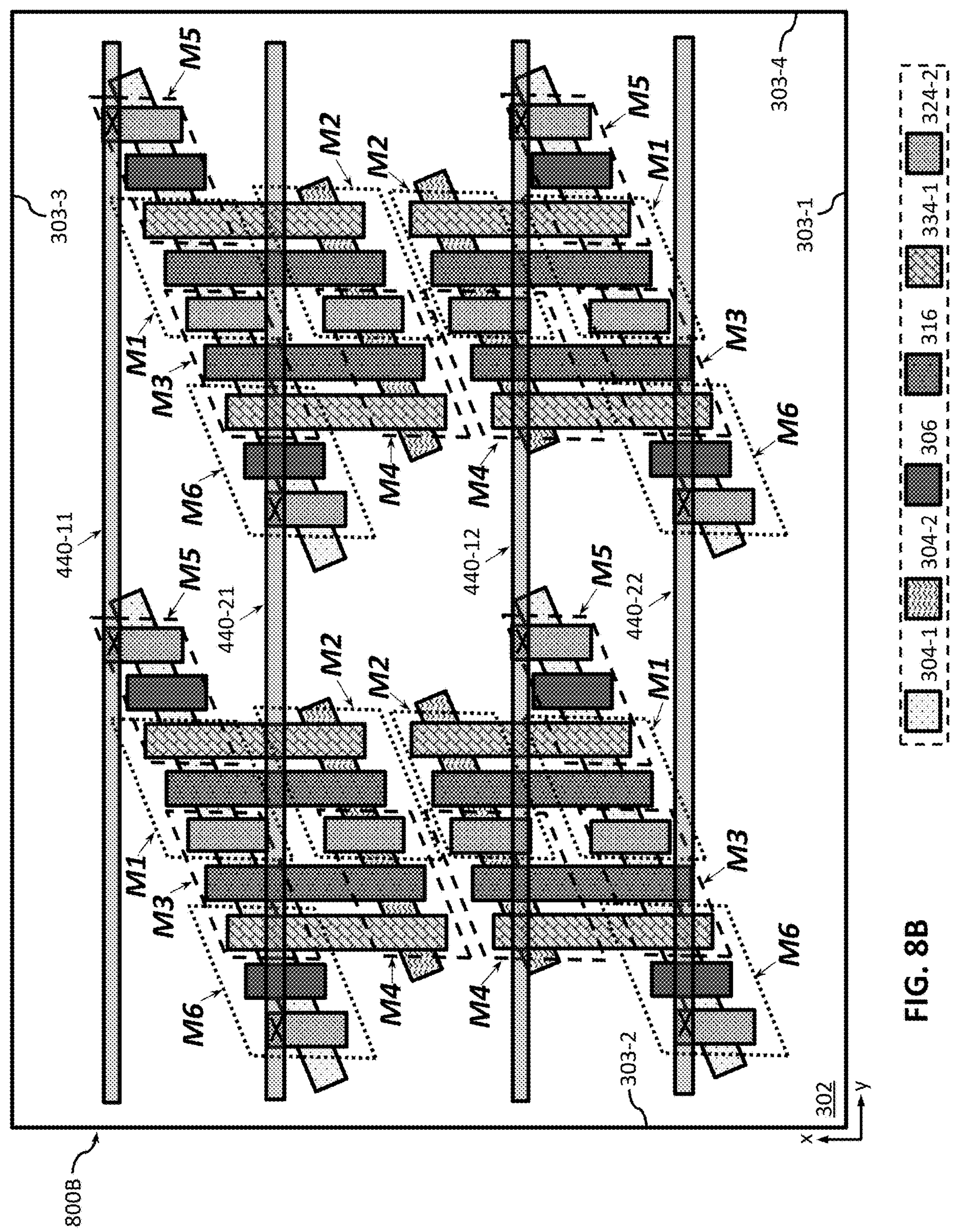

FIGS. 8A-8B provide top-down views of example IC devices implementing arrays of SRAM cells 400 of FIG. 5, in accordance with some embodiments.

An IC device 800A, shown in FIG. 8A, illustrates that the parallel elongated structures 304 of the SRAM cells 400 of FIG. 5 may be particularly suitable for being aligned so that multiple sets of the NMOS transistors of the SRAM cells may be provided over an individual N-type elongated structure 304-1 and so that multiple sets of the PMOS transistors of the SRAM cells may be provided over an individual P-type elongated structure 304-2. In such an arrangement, the BLs 440 may be angled to be at the substantially same angle with respect to the edges 303 of the support structure 302 as the elongated structures 304. For example, a longitudinal axis 320-1, shown in FIG. 8A, may be a common longitudinal axis for a first pair of the elongated structures 304-1 of different SRAM cells (the different SRAM cells being to the left and to the right of a line 810, shown in FIG. 8A). The BL 440-11 coupled to the second S/D contacts 324-2 of the transistors M5 of these two SRAM cells and the BL 440-21 coupled to the second S/D contacts 324-2 of the transistors M6 of these two SRAM cells may then be substantially aligned with the longitudinal axis 320-1 (e.g., projections of the BL 440-11 and the BL 440-21 onto the support structure 302 may be at substantially the same angle as a projection of the longitudinal axis 320-1 as measured, e.g., with respect to the edge 303-1). Similarly, a longitudinal axis 320-2, shown in FIG. 8A, may be a common longitudinal axis for a second pair of the elongated structures 304-1 of different SRAM cells (the different SRAM cells being to the left and to the right of the line 810). The BL 440-12 coupled to the second S/D contacts 324-2 of the transistors M5 of these two SRAM cells and the BL 440-22 coupled to the second S/D contacts 324-2 of the transistors M6 of these two SRAM cells may then be substantially aligned with the longitudinal axis 320-2 (e.g., projections of the BL 440-12 and the BL 440-22 onto the support structure 302 may be at substantially the same angle as a projection of the longitudinal axis 320-2 as measured, e.g., with respect to the edge 303-1).

Although not specifically shown in FIG. 8A, an isolation structure may be provided in the IC device 800A, e.g., substantially along the line 810, in order to electrically isolate the S/D regions of the transistors of different SRAM cells provided along a given elongated structure 304. In some embodiments, such an isolation structure may a continuous structure of an insulator material extending substantially along the x-axis of the example coordinate system shown. In other embodiments, such an isolation structure may be provided as a plurality of individual cuts in the elongated structures 304. For example, such an isolation structure may provide electrical isolation between the second S/D contacts 324-2 of the transistors M5 and M6 (belonging to different SRAM cells) of the upper elongated structure 304-1 of FIG. 8A, as well as provide electrical isolation between the second S/D contacts 324-2 of the transistors M5 and M6 (also belonging to different SRAM cells) of the lower elongated structure 304-1 of FIG. 8A. In another example, such an isolation structure may provide electrical isolation between the contact lines 334-1 of the transistors M2 and M4 (belonging to different SRAM cells) of the upper elongated structure 304-2 of FIG. 8A, as well as provide electrical isolation between the contact lines 334-1 of the transistors M2 and M4 (also belonging to different SRAM cells) of the lower elongated structure 304-2 of FIG. 8A. Thus, while the BLs 440 may be electrically continuous across multiple SRAM cells having their elongated structures 304-1 and 304-2 aligned with one another, the respective elongated structures 304-1 and 304-2 themselves of different SRAM cells aligned along a single line of symmetry are not electrically continuous. Analogous isolation structures may be provided in other arrays shown in the present drawings where multiple SRAM cells are provided along a given pair of N-type and P-type elongated structures 304.

An IC device 800B, shown in FIG. 8B, illustrates that, alternative to the embodiment of FIG. 8A, the parallel elongated structures 304 of the SRAM cells 400 of FIG. 5 may be particularly suitable for being staggered so that the BLs 440 coupled to different SRAM cells may be substantially aligned with the edges 303. For example, FIG. 8B illustrates an embodiment where the BLs 440 coupled to multiple SRAM cells 400 of FIG. 5 may extend substantially parallel to the edges 303-1 and 303-3 and substantially perpendicular to the edges 303-2 and 303-4.

Figure 9A:
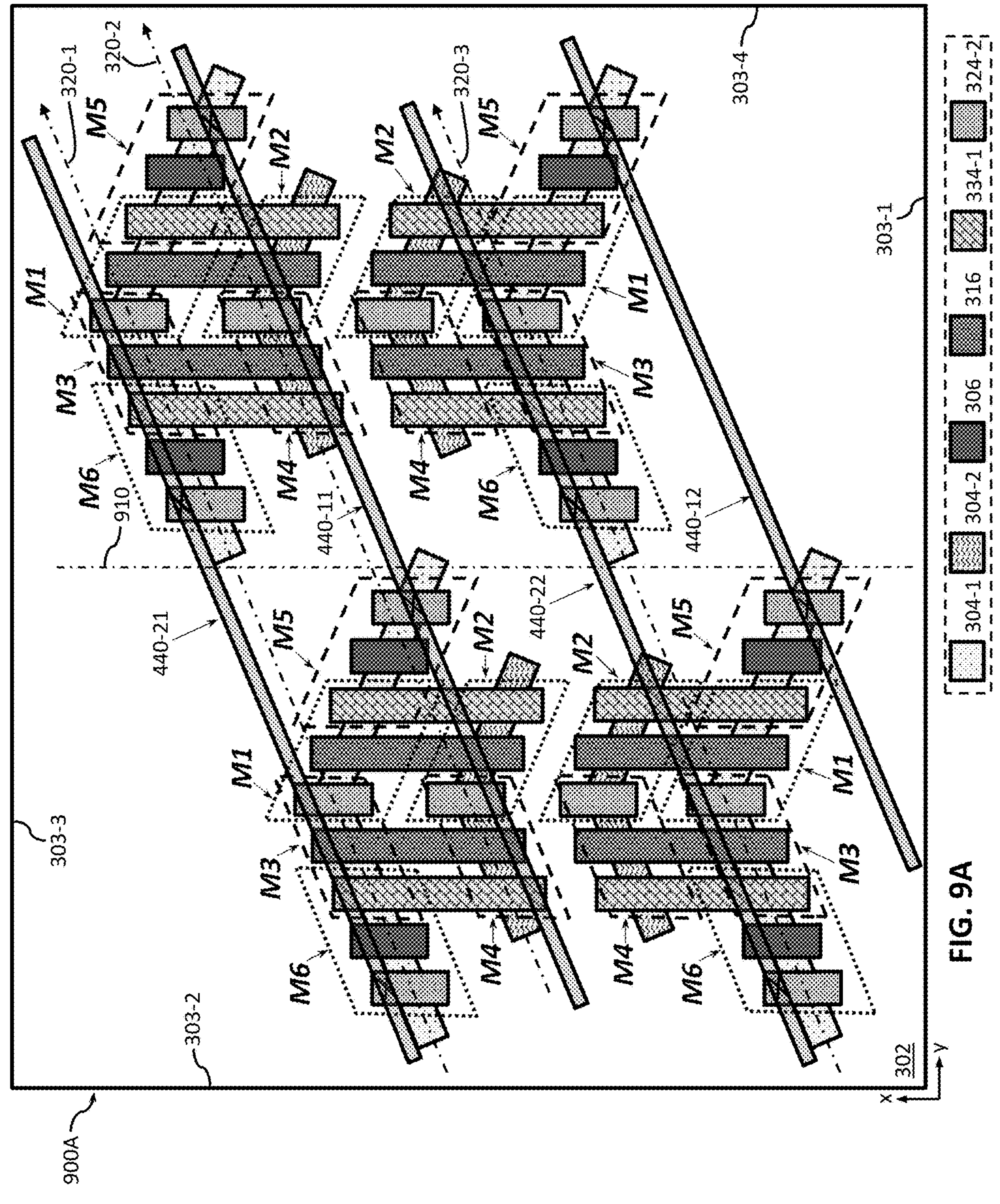
FIGS. 9A-9B provide top-down views of example IC devices implementing arrays of SRAM cells of FIG. 6, in accordance with some embodiments.
Figure 9B:
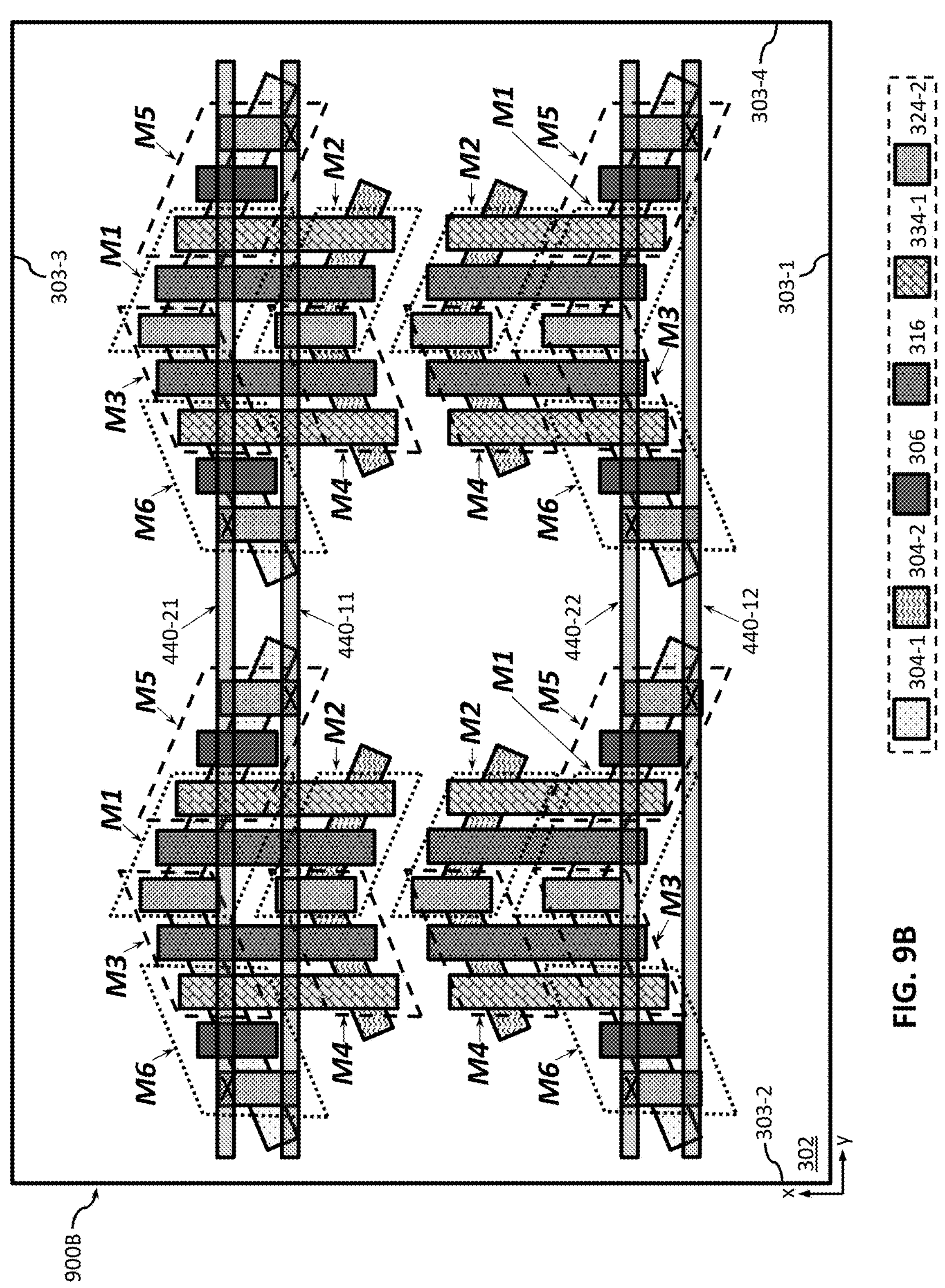

FIGS. 9A-9B provide top-down views of example IC devices implementing arrays of SRAM cells 400 of FIG. 6, in accordance with some embodiments.

An IC device 900A, shown in FIG. 9A, illustrates that the parallel first portions of multiple elongated structures 304 of the SRAM cells 400 of FIG. 6 may be particularly suitable for being aligned along a common longitudinal axis. In such an arrangement, the BLs 440 may be angled to be at the substantially same angle with respect to the edges 303 of the support structure 302 as the first portions of the elongated structures 304. For example, a longitudinal axis 320-1, shown in FIG. 9A, may be a common longitudinal axis for a first pair of the first portions of the elongated structures 304-1 of different SRAM cells (the different SRAM cells being to the left and to the right of a line 910, shown in FIG. 9A). The BL 440-21 coupled to the second S/D contacts 324-2 of the transistors M6 of these two SRAM cells may then be substantially aligned with the longitudinal axis 320-1 (e.g., a projection of the BL 440-21 onto the support structure 302 may be at substantially the same angle as a projection of the longitudinal axis 320-1 as measured, e.g., with respect to the edge 303-1). Similarly, a longitudinal axis 320-2, shown in FIG. 9A, may be a common longitudinal axis for a first pair of the first portions of the elongated structures 304-2 of different SRAM cells. The BL 440-11 coupled to the second S/D contacts 324-2 of the transistors M5 of these two SRAM cells may then be substantially aligned with the longitudinal axis 320-2 (e.g., a projection of the BL 440-11 onto the support structure 302 may be at substantially the same angle as a projection of the longitudinal axis 320-2 as measured, e.g., with respect to the edge 303-1). Furthermore, a longitudinal axis 320-3, shown in FIG. 9A, may be a common longitudinal axis for a second pair of the first portions of the elongated structures 304-1 of different SRAM cells (the different SRAM cells being to the left and to the right of the line 910). The BL 440-22 coupled to the second S/D contacts 324-2 of the transistors M6 of these two SRAM cells may then be substantially aligned with the longitudinal axis 320-3 (e.g., a projection of the BL 440-22 onto the support structure 302 may be at substantially the same angle as a projection of the longitudinal axis 320-3 as measured, e.g., with respect to the edge 303-1). In other embodiments of the IC device 900A (not shown in the present drawings), the parallel second portions of multiple elongated structures 304 of the SRAM cells 400 of FIG. 6 may be particularly suitable for being aligned along a common longitudinal axis, and the BLs 440 may be substantially aligned with said second portions.

An IC device 900B, shown in FIG. 9B, illustrates that, alternative to the embodiment of FIG. 9A, the nested elongated structures 304 of the SRAM cells 400 of FIG. 6 may be particularly suitable for being staggered so that the BLs 440 coupled to different SRAM cells may be substantially aligned with the edges 303. For example, FIG. 9B illustrates an embodiment where the BLs 440 coupled to multiple SRAM cells 400 of FIG. 6 may extend substantially parallel to the edges 303-1 and 303-3 and substantially perpendicular to the edges 303-2 and 303-4.

Figure 10A:
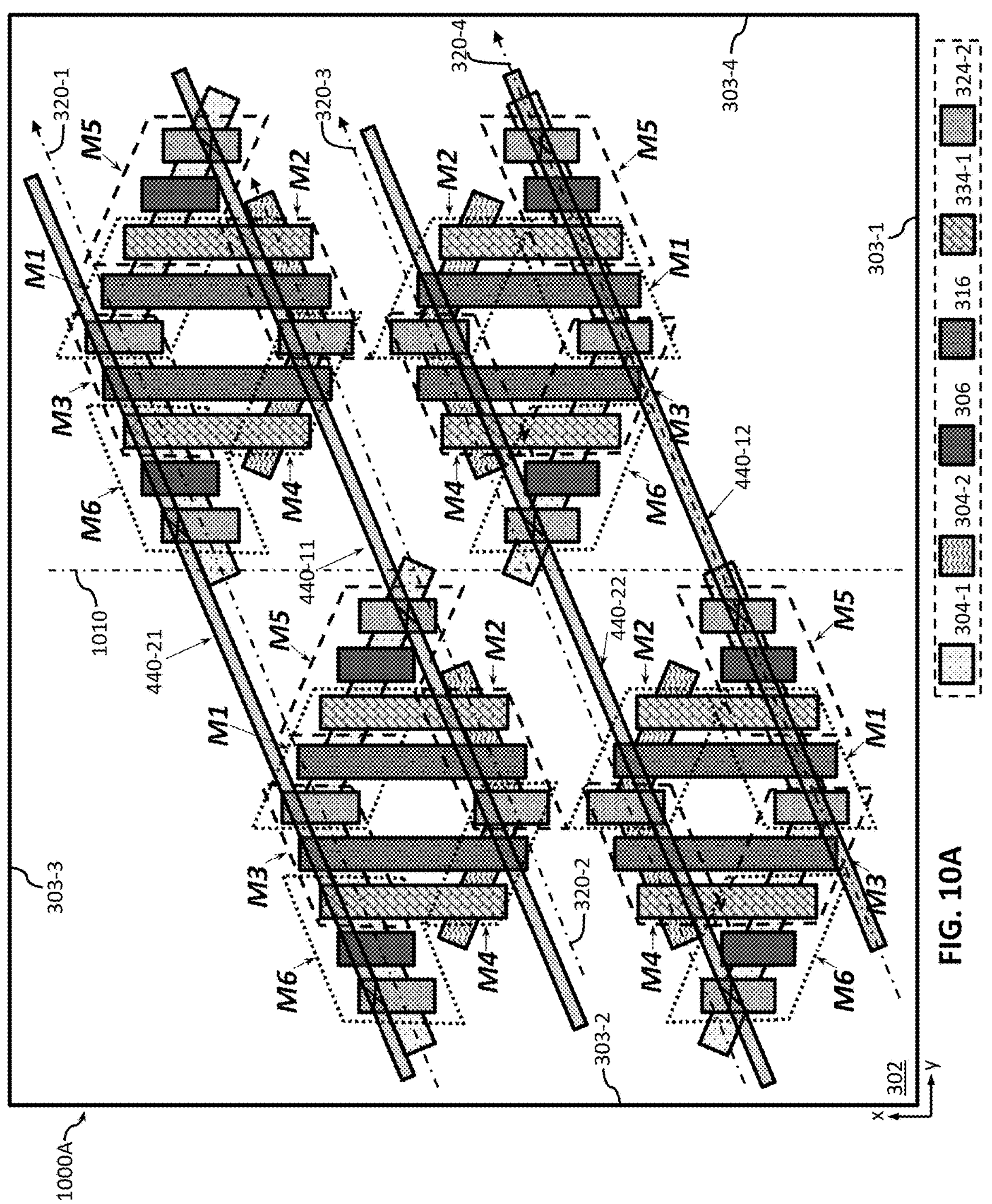
FIGS. 10A-10C provide top-down views of example IC devices implementing arrays of SRAM cells of FIG. 7, in accordance with some embodiments.
Figure 10B:
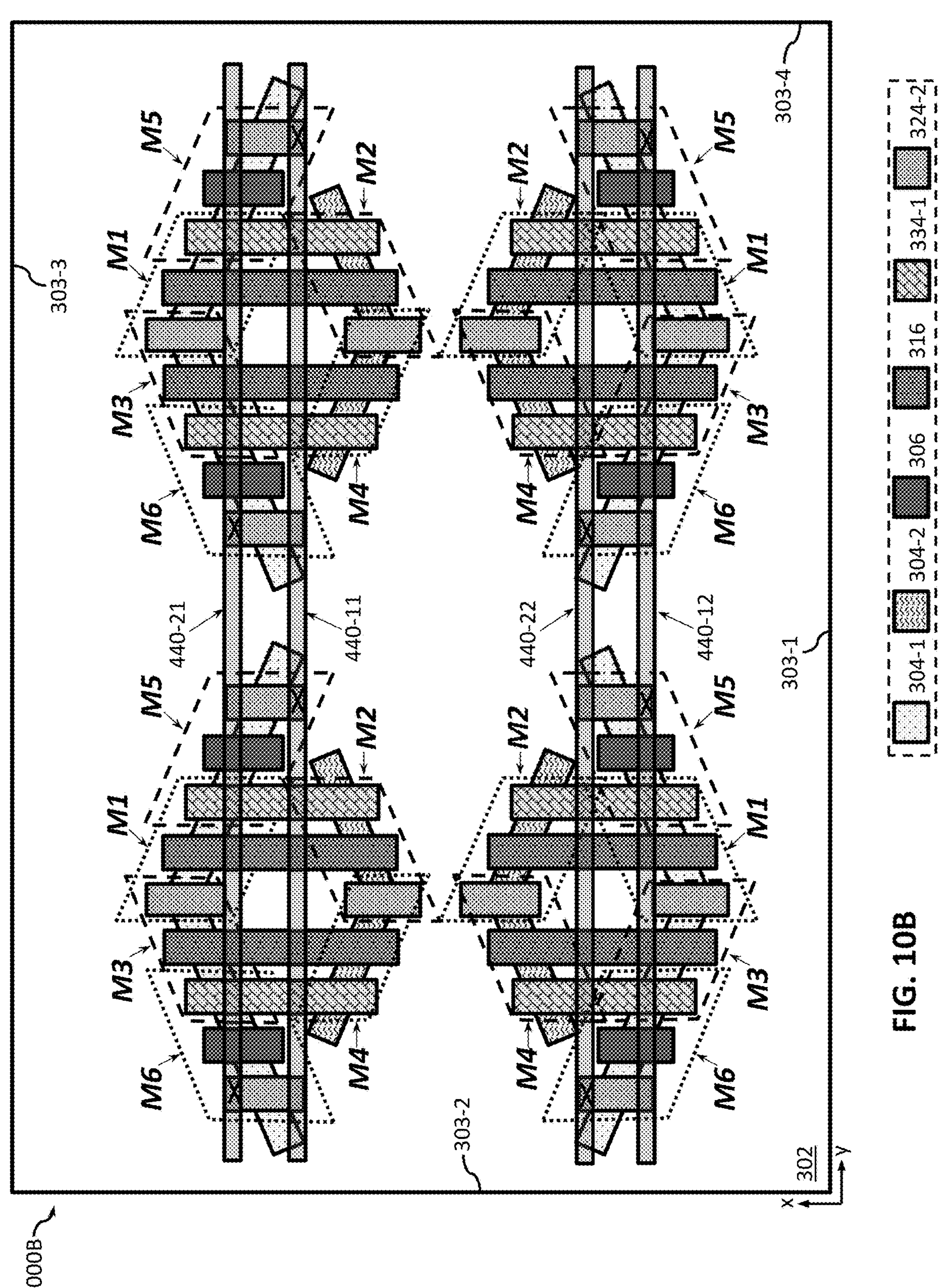
Figure 10C:
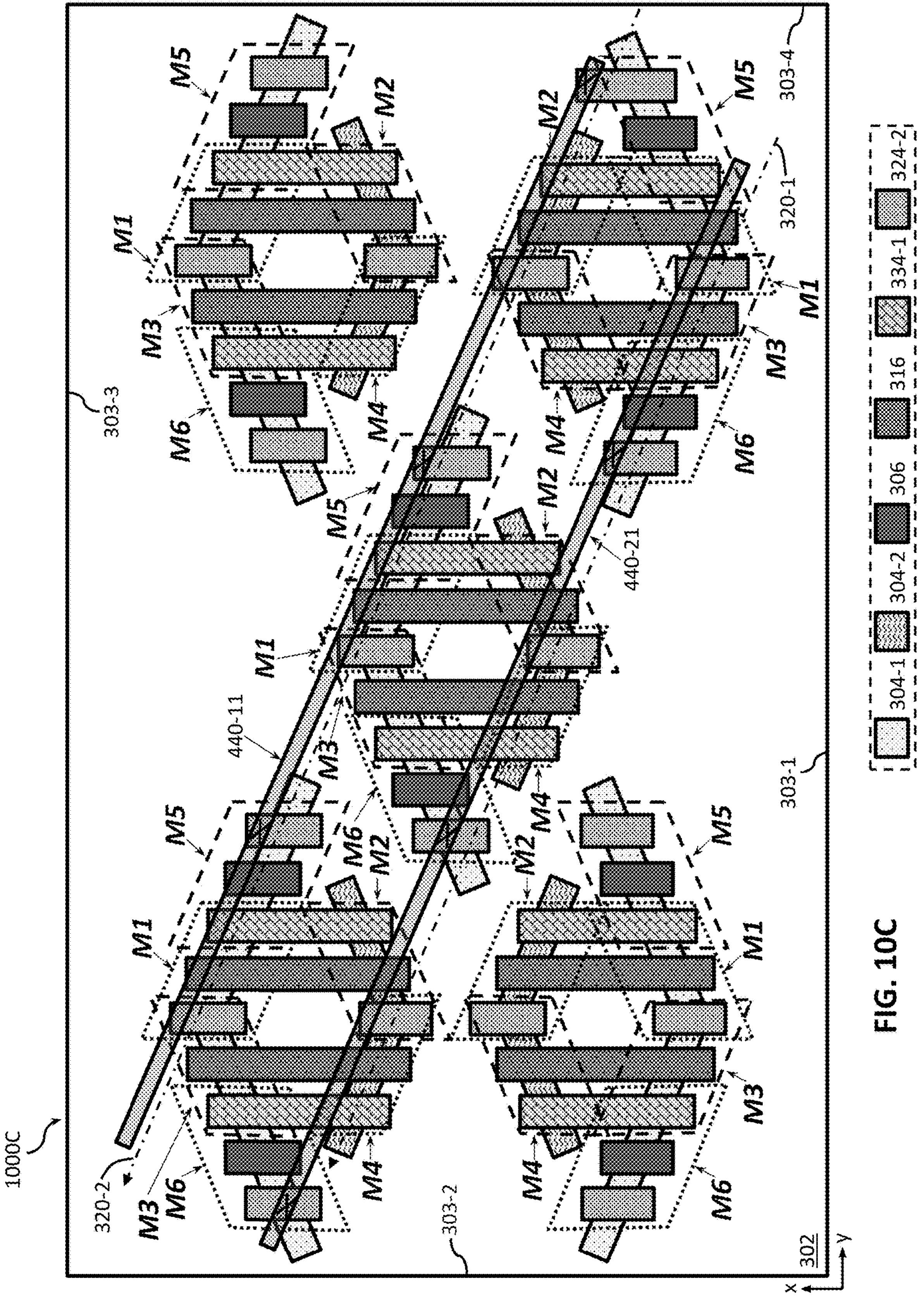

FIGS. 10A-10C provide top-down views of example IC devices implementing arrays of SRAM cells 400 of FIG. 7, in accordance with some embodiments.

An IC device 1000A, shown in FIG. 10A, illustrates that various pairs of parallel first or second portions of multiple elongated structures 304 of the SRAM cells 400 of FIG. 7 may be particularly suitable for being aligned along a common longitudinal axis. In such an arrangement, the BLs 440 may be angled to be at the substantially same angle with respect to the edges 303 of the support structure 302 as the first or second portions of the elongated structures 304. For example, a longitudinal axis 320-1, shown in FIG. 10A, may be a common longitudinal axis for a pair of the first portions of the elongated structures 304-1 of different SRAM cells of FIG. 7 (the different SRAM cells being to the left and to the right of a line 1010, shown in FIG. 10A). The BL 440-21 coupled to the second S/D contacts 324-2 of the transistors M6 of these two SRAM cells of FIG. 7 may then be substantially aligned with the longitudinal axis 320-1 (e.g., a projection of the BL 440-21 onto the support structure 302 may be at substantially the same angle as a projection of the longitudinal axis 320-1 as measured, e.g., with respect to the edge 303-1). Similarly, a longitudinal axis 320-2, shown in FIG. 10A, may be a common longitudinal axis for a pair of the second portions of the elongated structures 304-2 of different SRAM cells of FIG. 7. The BL 440-11 coupled to the second S/D contacts 324-2 of the transistors M5 of these two SRAM cells of FIG. 7 may then be substantially aligned with the longitudinal axis 320-2 (e.g., a projection of the BL 440-11 onto the support structure 302 may be at substantially the same angle as a projection of the longitudinal axis 320-2 as measured, e.g., with respect to the edge 303-1). Furthermore, a longitudinal axis 320-3, shown in FIG. 10A, may be a common longitudinal axis for a pair of the first portions of the elongated structures 304-2 of different SRAM cells (the different SRAM cells being to the left and to the right of the line 910). The BL 440-22 coupled to the second S/D contacts 324-2 of the transistors M6 of these two SRAM cells of FIG. 7 may then be substantially aligned with the longitudinal axis 320-3 (e.g., a projection of the BL 440-22 onto the support structure 302 may be at substantially the same angle as a projection of the longitudinal axis 320-3 as measured, e.g., with respect to the edge 303-1). Still further, a longitudinal axis 320-4, shown in FIG. 10A, may be a common longitudinal axis for a pair of the second portions of the elongated structures 304-1 of different SRAM cells of FIG. 7. The BL 440-12 coupled to the second S/D contacts 324-2 of the transistors M5 of these two SRAM cells of FIG. 7 may then be substantially aligned with the longitudinal axis 320-4 (e.g., a projection of the BL 440-12 onto the support structure 302 may be at substantially the same angle as a projection of the longitudinal axis 320-4 as measured, e.g., with respect to the edge 303-1).

An IC device 1000B, shown in FIG. 10B, illustrates that, alternative to the embodiment of FIG. 10A, the opposite elongated structures 304 of the SRAM cells 400 of FIG. 7 may be particularly suitable for being staggered so that the BLs 440 coupled to different SRAM cells may be substantially aligned with the edges 303. For example, FIG. 10B illustrates an embodiment where the BLs 440 coupled to multiple SRAM cells 400 of FIG. 7 may extend substantially parallel to the edges 303-1 and 303-3 and substantially perpendicular to the edges 303-2 and 303-4.

An IC device 1000C, shown in FIG. 10C, illustrates yet another embodiment, alternative to the embodiments of FIG. 10A and FIG. 10B, of staggering the opposite elongated structures 304 of the SRAM cells 400 of FIG. 7 in a way so that the BLs 440 coupled to different SRAM cells may be angled similar to the angling of the elongated structures 304. In such an arrangement, the BLs 440 may be angled to be at the substantially same angle with respect to the edges 303 of the support structure 302 as the first and/or second portions of the elongated structures 304. For example, a longitudinal axis 320-1, shown in FIG. 10A, may be a common longitudinal axis for a pair of the first portions of the elongated structures 304-2 and a first portion of the elongated structure 304-1 of three different SRAM cells of FIG. 7. The BL 440-21 coupled to the second S/D contacts 324-2 of the transistors M6 of these three SRAM cells of FIG. 7 may then be substantially aligned with the longitudinal axis 320-1 (e.g., a projection of the BL 440-21 onto the support structure 302 may be at substantially the same angle as a projection of the longitudinal axis 320-1 as measured, e.g., with respect to the edge 303-1). Similarly, a longitudinal axis 320-2, shown in FIG. 10A, may be a common longitudinal axis for a pair of the second portions of the elongated structures 304-1 and a second portion of the elongated structure 304-2 of these three SRAM cells of FIG. 7. The BL 440-11 coupled to the second S/D contacts 324-2 of the transistors M5 of these three SRAM cells of FIG. 7 may then be substantially aligned with the longitudinal axis 320-2 (e.g., a projection of the BL 440-11 onto the support structure 302 may be at substantially the same angle as a projection of the longitudinal axis 320-2 as measured, e.g., with respect to the edge 303-1).

FIGS. 8-10 merely provide some examples of arranging multiple SRAM cells 400 with angled transistors in an array. Other possibilities for arranging the SRAM cells 400 as shown in any of FIGS. 5-7 within an array, or any combination of various ones of these SRAM cells within a single array are possible and are within the scope of the present disclosure.

Figure 11:
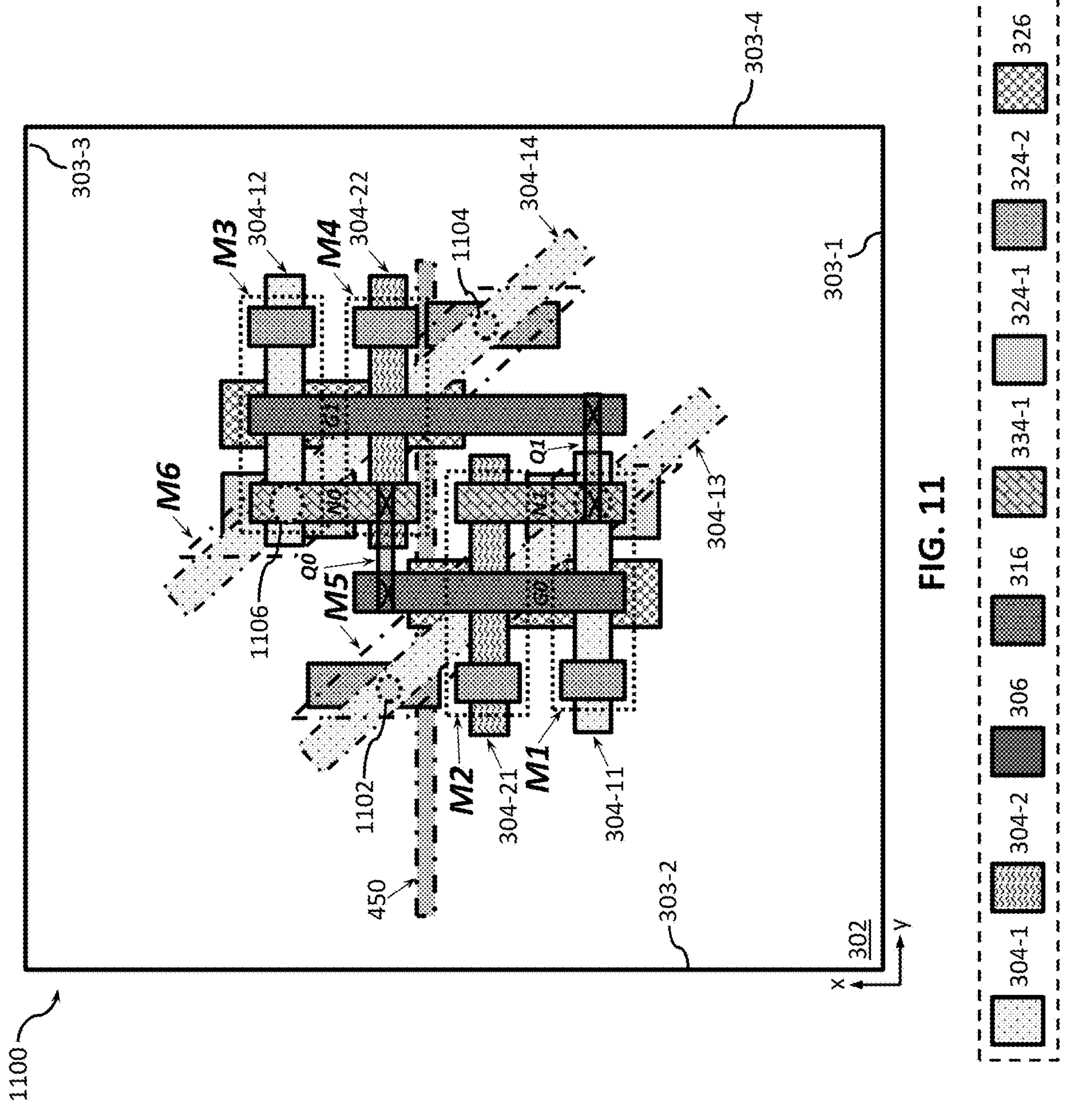
FIG. 11 provides a top-down view of an IC device with an SRAM cell having different transistors implemented on different sides of a support structure and with some transistors being angled transistors, in accordance with some embodiments.

FIG. 11 provides a top-down view of an IC device 1100 with a single SRAM cell 400 having different transistors implemented on different sides of a support structure and with some transistors being angled transistors, in accordance with some embodiments. FIG. 11 illustrates a top-down cross-sectional view of an example physical layout of the transistors M1-M6 of the SRAM cell 400 of FIG. 4, where the NMOS transistors M1, M3, M5, and M6 are provided along the N-type elongated structures 304-1 and where the PMOS transistors M2 and M4 are provided along the P-type elongated structures 304-2. This view is similar to the views of FIGS. 5-7, except that FIG. 11 illustrates only one SRAM cell 400, while FIGS. 5-7 illustrated two such cells. Analogous to the views of FIGS. 5-7, FIG. 11 illustrates the support structures 302 and its edges 303, so that the relationships between the arrangements of different transistors M1-M6 of the IC device 1100 with respect to the edges 303 of the support structure 302 are clear.

The actual physical layout of the transistors M1-M6 of the IC device 1100 is different from those of FIGS. 5-7 in that FIG. 11 illustrates an embodiment where the transistors M1-M4 are implemented on one side of the support structure 302, while the transistors M5-M6 are implemented on another side. Some of the following descriptions are provided with reference to the transistors M1-M4 being implemented on the front side of the support structure 302 and the transistors M5-M6 being implemented on the back side. However, these descriptions are equally applicable if the designations of the front side and the back side are reversed (e.g., in some embodiments, the transistors M1-M4 may be implemented on the back side of the support structure 302 and the transistors M5-M6 may be implemented on the front side).

Transistors M5-M6 provided on the other side from the transistors M1-M4 already implies that the transistors M5 and M6 cannot be provided along the same elongated structure 304 as the transistors M1 and M3, as was the case for the SRAM cells 400 of FIGS. 5-7. In fact, FIG. 11 illustrates an embodiment where each of the transistors M1-M6 is provided along a respective elongated structure, where the N-type elongated structures 304-1 and the P-type elongated structures 304-2 as described above are labeled in FIG. 11 with two digits after the dash, the second digit representing an instance of a given type of an elongated structure. In particular, as shown in FIG. 11, the transistor M1 is provided along an elongated structure 304-11 (e.g., a first instance of the N-type elongated structure 304-1), the transistor M2 is provided along an elongated structure 304-21 (e.g., a first instance of the P-type elongated structure 304-2), the transistor M3 is provided along an elongated structure 304-12 (e.g., a second instance of the N-type elongated structure 304-1), the transistor M4 is provided along an elongated structure 304-22 (e.g., a second instance of the P-type elongated structure 304-2), the transistor M5 is provided along an elongated structure 304-13 (e.g., a third instance of the N-type elongated structure 304-1), and the transistor M6 is provided along an elongated structure 304-14 (e.g., a fourth instance of the N-type elongated structure 304-1). The elongated structures 304-13 and 304-14 of the are shown in FIG. 11 with dash-dotted outlines to represent that the transistors M5 and M6 are provided on a different side (e.g., on the back side) of the support structure 302 than the transistors M1-M4.

Providing the storage transistors (e.g., the transistors M1-M4) and the access transistors (e.g., the transistors M5-M6) of the SRAM cell 400 on different sides of the support structure 302 may advantageously allow reducing the footprint of the SRAM cell 400 in that the footprint of the storage transistors may at least partially overlap with the footprint of the access transistors. Because there are less access transistors than storage transistors, in some embodiments, the footprint of the access transistors of a given SRAM cell 400 of the IC device may be substantially within the footprint of the storage transistors of that SRAM cell 400.

In general, any of the transistors M1-M6 may be an angled transistor as described herein. FIG. 11 illustrates an embodiment where only the transistors M5-M6 are angled transistors because such an embodiment may allow achieving a particularly compact footprint of the SRAM cell. However, in other embodiments, other arrangements of angled and non-angled transistors are possible to implement the SRAM cell 400 with some transistors being on the front side and other transistors being on the back side of the support structure 302.

As shown in FIG. 11, the transistors M1 and M2 may have a first instance of a shared gate line 316 providing coupled gates of these transistors (e.g., the node G0) and further being coupled to the interconnect Q0, similar to the shared gate line node G0 and the interconnect Q0 of the SRAM cell 400-1 of FIGS. 5-7. Similarly, the transistors M3 and M4 may have a second instance of the shared gate line 316 providing coupled gates of these transistors (e.g., the node G1) and further being coupled to the interconnect Q1, similar to the shared gate line node G1 and the interconnect Q1 of the SRAM cell 400-1 of FIGS. 5-7. As shown in FIG. 11, the interconnect Q0 is to electrically connect the nodes G0 and N0, while the interconnect Q1 is to electrically connect the nodes G1 and N1, as was described above. FIG. 11 illustrates that, when the transistors M1-M4 are implemented on one side of the support structure 302 and the transistors M5-M6 on the other, the nodes G0, N0, G1, and N1, as well as the interconnects Q0 and Q1 may be on the same side as the transistors M1-M4, since these nodes and interconnects provide electrical connectivity between various terminals of the transistors M1-M4. Similar to some of the previous drawings, electrical connections of each of the interconnects Q0 and Q1 to respective ones of the nodes N0, N1, G0, and G1 are shown in FIG. 11 with crosses in areas where the interconnects Q0 and Q1 overlap the respective nodes N0, N1, G0, and G1.

FIG. 11 further illustrates how the angled elongated structures 304-13 and 304-14 of the transistors M5 and M6 may be arranged with respect to the transistor arrangement of the transistors M1-M4 on the other side. In particular, FIG. 11 illustrates that a first and a second instances of a back side gate line 326 may be provided on the side where the angled elongated structures 304-13 and 304-14 are provided. The first instance of the back side gate line 326 may form, or may be electrically coupled to (e.g., directly connected to), the gate 306 of the transistor M5, while the second instance of the back side gate line 326 may form, or may be electrically coupled to (e.g., directly connected to), the gate 306 of the transistor M6. In some embodiments, the first and second instances of the back side gate lines 326 may be provided so that their footprints on the support structure 302 at least partially overlap with those of, respectively, the gate lines G0 and G1. This is shown in FIG. 11 with the backside gate line 326 that forms the gate 306 of the transistor M5 being substantially behind the gate line 316 that couples the gates 306 of the transistors M1 and M2, and with the backside gate line 326 that forms the gate 306 of the transistor M6 being substantially behind the gate line 316 that couples the gates 306 of the transistors M3 and M4.

FIG. 11 illustrates that the angled elongated structure 304-13 of the transistor M5 may be arranged so that the first S/D contact 324-1 of the transistor M5 is substantially behind the node N1 so that the first S/D contact 324-1 of the transistor M5 may be coupled (e.g., directly connected) to the node N1 and to the interconnect Q1 on the front side. Similarly, FIG. 11 illustrates that the angled elongated structure 304-14 of the transistor M6 may be arranged so that the first S/D contact 324-1 of the transistor M6 is substantially behind the node N0 so that the first S/D contact 324-1 of the transistor M6 may be coupled (e.g., directly connected) to the node N0 and to the interconnect Q0 on the front side. An approximate location where the second S/D contact 324-2 of the transistor M5 may be coupled (e.g., directly connected) to the second S/D region of the transistor M5 in the angled elongated structure 304-13 is shown in FIG. 11 as a location 1102. Similarly, an approximate location where the second S/D contact 324-2 of the transistor M6 may be coupled (e.g., directly connected) to the second S/D region of the transistor M6 in the angled elongated structure 304-14 is shown in FIG. 11 as a location 1104. An approximate location where the first S/D contact 324-1 of the transistor M6 may be coupled (e.g., directly connected) to the node N0 on the front side is shown in FIG. 11 as a location 1106. Each of the first and second contacts 324 of the transistors M5 and M6 may be provided on the back side, e.g., on the side opposite to where the transistors M1-M4 are provided. Furthermore, FIG. 11 illustrates that, in some embodiments, the second S/D contacts 324-2 of the transistors M1, M2, and M5 may be substantially aligned (e.g., their projections onto the support structure 302 may be aligned) even though the second S/D contact 324-2 of the transistor M5 is on the back side and the second S/D contacts 324-2 of the transistors M1 and M2 are on the front side. Similarly, FIG. 11 illustrates that, in some embodiments, the second S/D contacts 324-2 of the transistors M3, M4, and M6 may be substantially aligned (e.g., their projections onto the support structure 302 may be aligned) even though the second S/D contact 324-2 of the transistor M6 is on the back side and the second S/D contacts 324-2 of the transistors M3 and M4 are on the front side. FIG. 11 further illustrates that, in some embodiments, the nodes N0 and N1 may be substantially aligned (e.g., their projections onto the support structure 302 may be aligned) and that, in some embodiments, the first S/D contacts 324-1 of the transistors M5 and M6 may be substantially aligned.

FIG. 11 further illustrates an example location and orientation of the WL 450, connecting the gates of the transistors M5 and M6 of the SRAM cell 400. As shown in FIG. 11, in some embodiments, the WL 450 may be provided on the back side of the support structure and may be substantially aligned with the edges 303 (e.g., may be parallel to the edges 303-1 and 303-3). To that end, the WL 450 may be coupled to (e.g., directly connected to) the first instance of the back side gate line 326 and the WL 450 may be coupled to (e.g., directly connected to) the second instance of the back side gate line 326.

Any of the SRAM devices with angled transistors described herein (e.g., any of the IC devices as described with reference to FIGS. 5-11) may be implemented in any suitable components. For example, in various embodiments, SRAM devices with angled transistors as described herein may be part of one or more of: a central processing unit, a memory device (e.g., a high-bandwidth memory device), a memory cell, a logic circuit, input/output circuitry, a field programmable gate array (FPGA) component such as an FPGA transceiver or an FPGA logic, a power delivery circuitry, an amplifier (e.g., a III-V amplifier), Peripheral Component Interconnect Express (PCIE) circuitry, Double Data Rate (DDR) transfer circuitry, a computing device (e.g., a wearable or a handheld computing device), etc.

The SRAM devices with angled transistors described herein (e.g., any of the IC devices as described with reference to FIGS. 5-11) may be included in any suitable electronic device. FIGS. 12-16 illustrate various examples of apparatuses that may include one or more of the SRAM devices with angled transistors disclosed herein.

Figure 12:
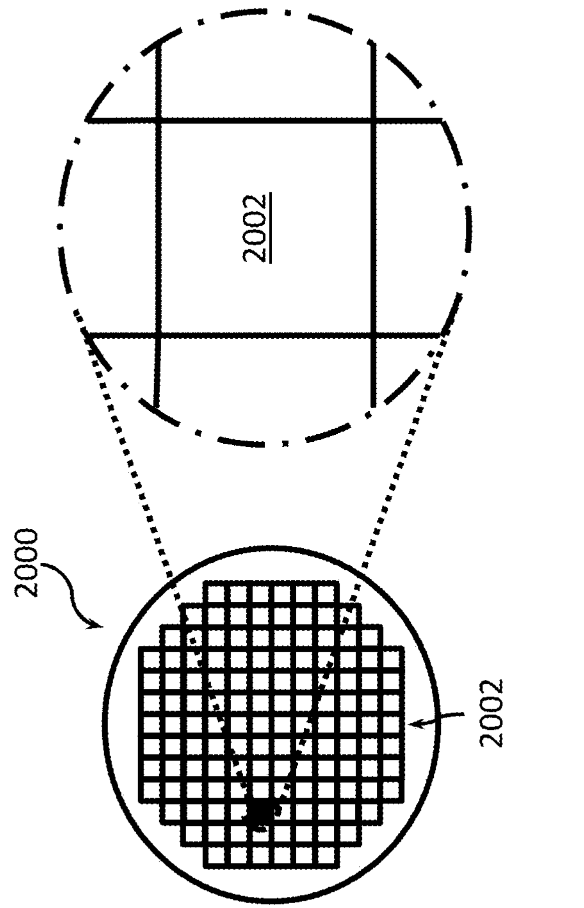
FIG. 12 provides top views of a wafer and dies that may include one or more SRAM devices with angled transistors in accordance with any of the embodiments disclosed herein.

FIG. 12 illustrates top views of a wafer 2000 and dies 2002 that may include one or more SRAM devices with angled transistors (e.g., any of the IC devices as described with reference to FIGS. 5-11) in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 13. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more SRAM devices with angled transistors as described herein). After the fabrication of the semiconductor product is complete (e.g., after manufacture of any embodiment of the SRAM devices with angled transistors as described herein), the wafer 2000 may undergo a singulation process in which each of the dies 2002 is separated from one another to provide discrete “chips” of the semiconductor product. In particular, SRAM devices with angled transistors as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., a hysteretic memory device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 15) or other logic that is configured to store information in the memory devices or execute instructions stored in the memory array.

Figure 13:
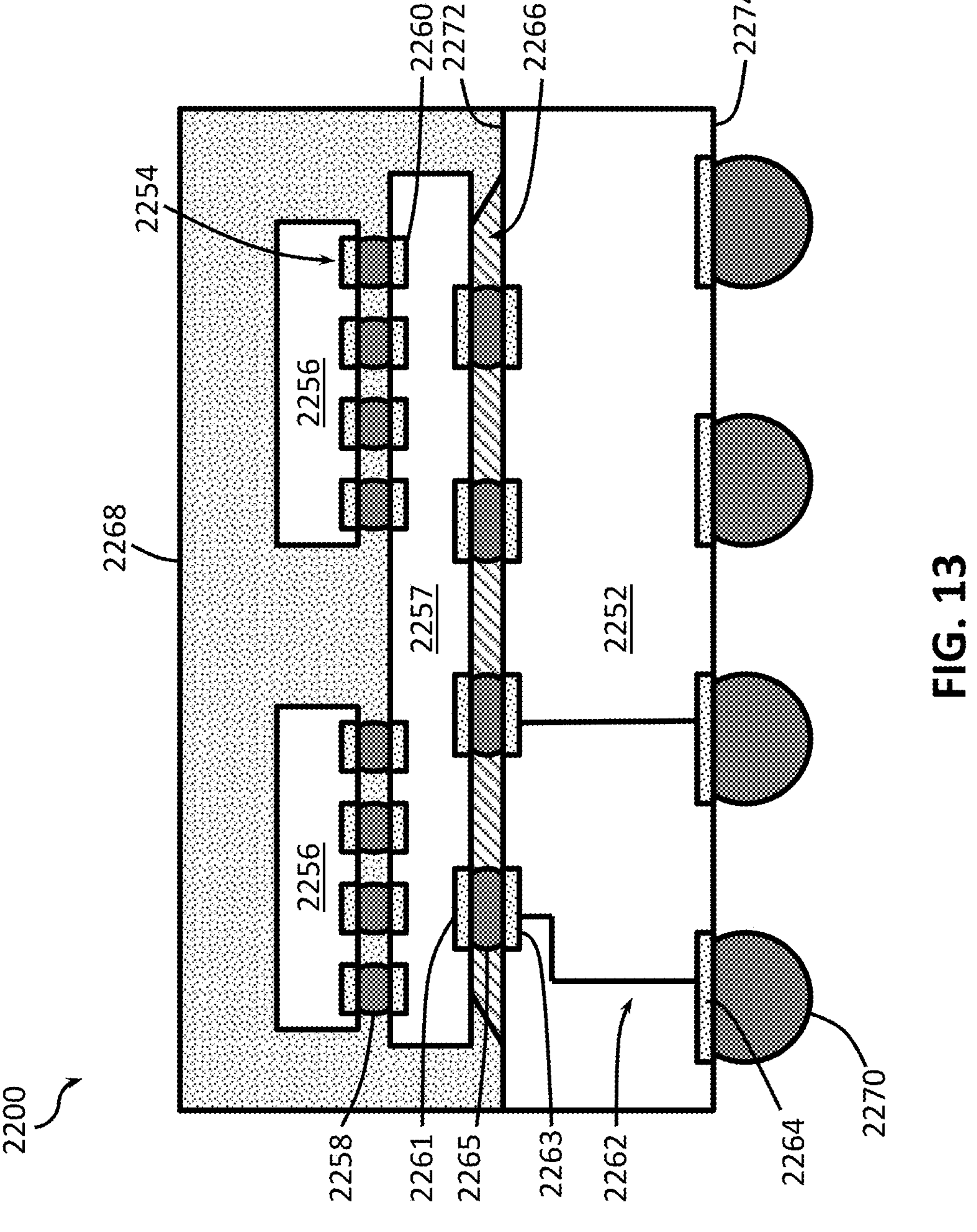
FIG. 13 is a cross-sectional side view of an IC package that may include one or more SRAM devices with angled transistors in accordance with any of the embodiments disclosed herein.

FIG. 13 is a side, cross-sectional view of an example IC package 2200 that may include one or more SRAM devices with angled transistors (e.g., any of the IC devices as described with reference to FIGS. 5-11) in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 13 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 13 are solder bumps, but any suitable first-level interconnects 2258 may be used. As used herein, a “conductive contact” may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 13 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 14.

The dies 2256 may take the form of any of the embodiments of the die 2002 discussed herein (e.g., may include any of the embodiments of the SRAM devices with angled transistors as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high-bandwidth memory), including embedded memory dies as described herein. In some embodiments, any of the dies 2256 may include one or more SRAM devices with angled transistors, e.g., as discussed above; in some embodiments, at least some of the dies 2256 may not include any SRAM devices with angled transistors.

The IC package 2200 illustrated in FIG. 13 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 13, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 14:
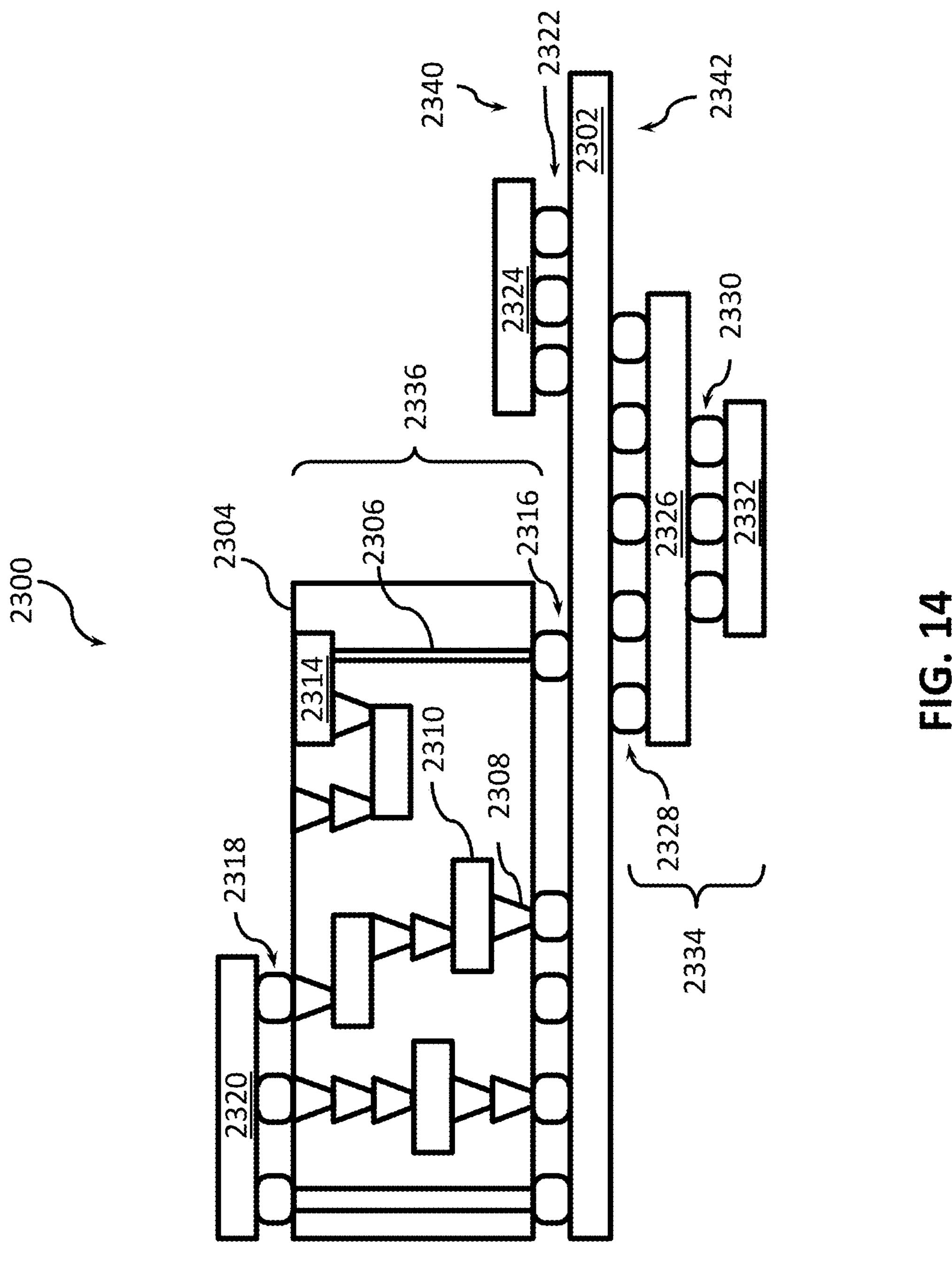
FIG. 14 is a cross-sectional side view of an IC device assembly that may include one or more SRAM devices with angled transistors in accordance with any of the embodiments disclosed herein.

FIG. 14 is a cross-sectional side view of an IC device assembly 2300 that may include components having one or more SRAM devices with angled transistors (e.g., any of the IC devices as described with reference to FIGS. 5-11) in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more SRAM devices with angled transistors in accordance with any of the embodiments disclosed herein; e.g., any of the IC packages discussed below with reference to the IC device assembly 2300 may take the form of any of the embodiments of the IC package 2200 discussed above with reference to FIG. 13 (e.g., may include one or more SRAM devices with angled transistors provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 14 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 14), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 12), an IC device, or any other suitable component. In particular, the IC package 2320 may include one or more SRAM devices with angled transistors as described herein. Although a single IC package 2320 is shown in FIG. 14, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 14, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 14 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 15:
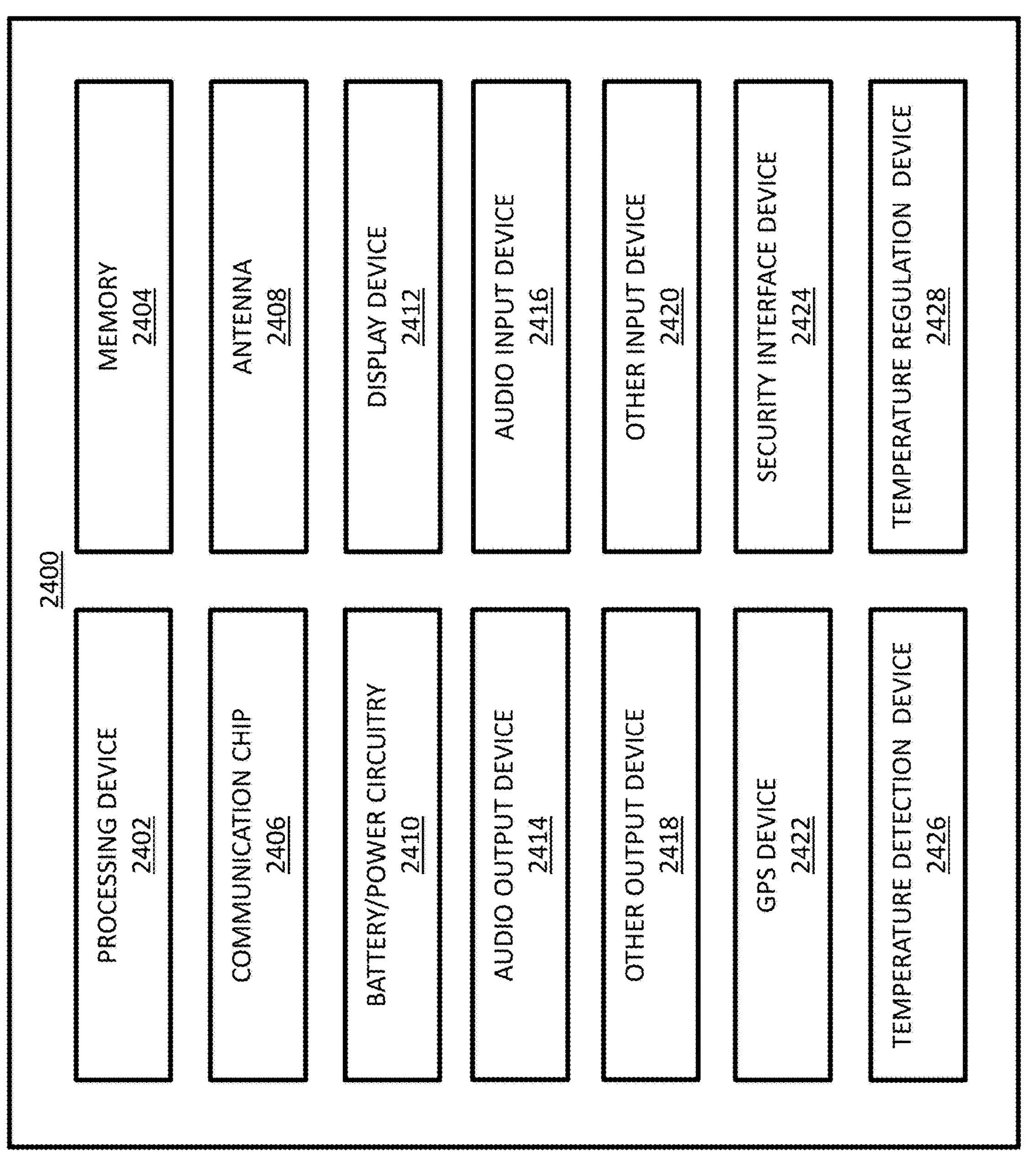
FIG. 15 is a block diagram of an example computing device that may include one or more SRAM devices with angled transistors in accordance with any of the embodiments disclosed herein.

FIG. 15 is a block diagram of an example computing device 2400 that may include one or more components including one or more SRAM devices with angled transistors (e.g., any of the IC devices as described with reference to FIGS. 5-11) in accordance with any of the embodiments disclosed herein. For example, any suitable ones of the components of the computing device 2400 may include a die (e.g., the die 2002 of FIG. 12) having one or more SRAM devices with angled transistors as described herein. Any one or more of the components of the computing device 2400 may include, or be included in, an IC package 2200 of FIG. 13 or an IC device 2300 of FIG. 14.

A number of components are illustrated in FIG. 15 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 15, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque magnetic RAM (MRAM). In some embodiments, SRAM devices with angled transistors as described herein may be part of the memory 2404.

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy corelates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 16:
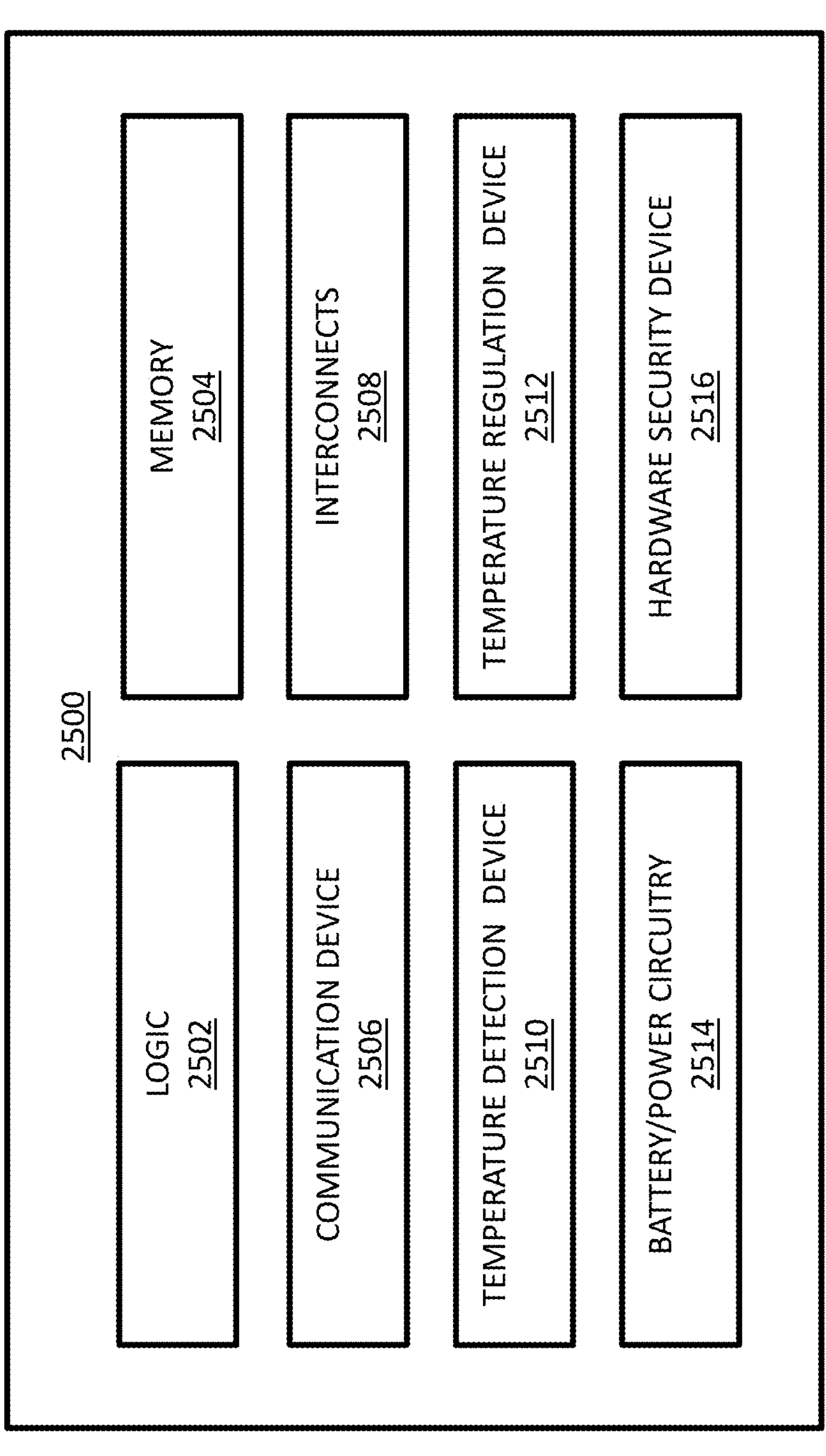
FIG. 16 is a block diagram of an example processing device that may include one or more SRAM devices with angled transistors in accordance with any of the embodiments disclosed herein.

FIG. 16 is a block diagram of an example processing device 2500 that may include one or more SRAM devices with angled transistors (e.g., any of the IC devices as described with reference to FIGS. 5-11) in accordance with any of the embodiments disclosed herein. For example, any suitable ones of the components of the processing device 2500 may include a die (e.g., the die 2002 of FIG. 12) having one or more SRAM devices with angled transistors as described herein. Any one or more of the components of the processing device 2500 may include, or be included in, an IC device 2300 (FIG. 14). Any one or more of the components of the processing device 2500 may include, or be included in, an IC package 2200 of FIG. 13 or an IC device 2300 of FIG. 14. Any one or more of the components of the processing device 2500 may include, or be included in, a computing device 2400 of FIG. 15; for example, the processing device 2500 may be the processing device 2402 of the computing device 2400.

A number of components are illustrated in FIG. 16 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 16, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 15). In particular, the memory 2504 may include one or more SRAM devices with angled transistors as described herein. In some embodiments, the memory 2504 may be a designated device configured to provide storage functionality for the components of the processing device 2500 (e.g., local), while the memory 1604 may be configured to provide system-level storage functionality for the entire computing device 2400 (e.g., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, e.g., the size and capabilities of each component. With hierarchical memory, each of the various memory components can be viewed as part of a hierarchy of memories ($m_1, m_2, \ldots, m_n$) in which each member $m_i$ is typically smaller and faster than the next highest member of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 15). In some embodiments, the communication device 2506 may be a designated device configured to provide communication functionality for the components of the processing device 2500 (e.g., local), while the communication chip 2406 may be configured to provide system-level communication functionality for the entire computing device 2400 (e.g., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 2426 of FIG. 15 but configured to determine temperatures on a more local scale, e.g., of the processing device 2500 of components thereof. In some embodiments, the temperature detection device 2510 may be a designated device configured to provide temperature detection functionality for the components of the processing device 2500 (e.g., local), while the temperature detection device 2426 may be configured to provide system-level temperature detection functionality for the entire computing device 2400 (e.g., global).

The processing device 2500 may include a temperature regulation device 2512 which may be implemented substantially as described above with reference to the temperature regulation device 2428 of FIG. 15 but configured to regulate temperatures on a more local scale, e.g., of the processing device 2500 of components thereof. In some embodiments, the temperature regulation device 2512 may be a designated device configured to provide temperature regulation functionality for the components of the processing device 2500 (e.g., local), while the temperature regulation device 2428 may be configured to provide system-level temperature regulation functionality for the entire computing device 2400 (e.g., global).

The processing device 2500 may include a battery/power circuitry 2514 which may be implemented substantially as described above with reference to the battery/power circuitry 2410 of FIG. 15. In some embodiments, the battery/power circuitry 2514 may be a designated device configured to provide battery/power functionality for the components of the processing device 2500 (e.g., local), while the battery/power circuitry 2410 may be configured to provide system-level battery/power functionality for the entire computing device 2400 (e.g., global).

The processing device 2500 may include a hardware security device 2516 which may be implemented substantially as described above with reference to the security interface device 2424 of FIG. 15. In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

The above description of illustrated implementations of the disclosure, including what is described in the Abstract, is not intended to be exhaustive or to limit the disclosure to the precise forms disclosed. Unless specified otherwise, in various embodiments, features described with respect to one of the drawings may be combined with those described with respect to other drawings.

The following paragraphs provide various examples of the embodiments disclosed herein.

Example A1 provides an IC device that includes a die (or, more generally, a support structure that may be, e.g., a die, a substrate, a carrier substrate, etc.); a first elongated structure (e.g., a fin or a nanoribbon) over the die, the first elongated structure having a first longitudinal axis, where, as used herein, a structure or an element described to be over a die may be integrated in, on, or at least partially over the die; a second elongated structure (e.g., a fin or a nanoribbon) over the die, the second elongated structure having a second longitudinal axis; and a plurality of transistors, each including a gate, a first region, and a second region, where one of the first region and the second region is a source region and another one of the first region and the second region is a drain region, and where the plurality of transistors includes transistors M1, M2, M3, and M4. In such an IC device, at least one of the first longitudinal axis and the second longitudinal axis is at an angle between 10 degrees and 80 degrees with respect to one or more edges of the die (and both longitudinal axes being substantially parallel to the plane of the die, e.g., to the plane of the front side or the back side of the die); the first region and the second region of each of the transistors M1 and M3 are in the first elongated structure; the first region and the second region of each of the transistors M2 and M4 are in the second elongated structure; the first region of the transistor M1 is coupled to the first region of the transistor M2, and the gate of the transistor M1 is coupled to the gate of the transistor M2; and the first region of the transistor M3 is coupled to the first region of the transistor M4, and the gate of the transistor M3 is coupled to the gate of the transistor M4.

Example A2 provides the IC device according to example A1, where each of the first region of the transistor M1 and the first region of the transistor M2 is coupled to a first bitline; each of the gate of the transistor M1 and the gate of the transistor M2 is coupled to a second bitline; each of the first region of the transistor M3 and the first region of the transistor M4 is coupled to the second bitline; and each of the gate of the transistor M3 and the gate of the transistor M4 is coupled to the first bitline.

Example A3 provides the IC device according to example A2, where, during operation of the IC device, a signal on the first bitline is complementary to a signal on the second bitline.

Example A4 provides the IC device according to any one of examples A2-3, where the plurality of transistors further includes transistors M5 and M6; the first region and the second region of each of the transistors M5 and M6 are in the first elongated structure; each of the first region of the transistor M1 and the first region of the transistor M2 is coupled to the first bitline by being coupled to the first region of the transistor M5 and the second region of the transistor M5 being coupled to the first bitline; each of the gate of the transistor M1 and the gate of the transistor M2 is coupled to the second bitline by being coupled to the first region of the transistor M6 and the second region of the transistor M6 being coupled to the second bitline; each of the first region of the transistor M3 and the first region of the transistor M4 is coupled to the second bitline by being coupled to the first region of the transistor M6 and the second region of the transistor M6 being coupled to the second bitline; and each of the gate of the transistor M3 and the gate of the transistor M4 is coupled to the first bitline by being coupled to the first region of the transistor M5 and the second region of the transistor M5 being coupled to the first bitline.

Example A5 provides the IC device according to example A4, where the gate of each of the transistor M5 and the transistor M6 is coupled to a wordline.

Example A6 provides the IC device according to any one of examples A1-5, where the first elongated structure includes a semiconductor material of a first type, the second elongated structure includes a semiconductor material of a second type, one of the first type and the second type is an N-type semiconductor material and another one of the first type and the second type is a P-type semiconductor material.

Example A7 provides the IC device according to any one of examples A1-6, where the first elongated structure is a first fin extending away from a surface of the die, and the second elongated structure is a second fin extending away from the surface of the die.

Example A8 provides the IC device according to any one of examples A1-6, where the first elongated structure is a first nanowire or nanoribbon extending parallel to a surface of the die, and the second elongated structure is a second nanowire or nanoribbon extending parallel to the surface of the die.

Example A9 provides the IC device according to any one of examples A1-8, where each of the first longitudinal axis and the second longitudinal axis is at the angle between 10 degrees and 80 degrees with respect to the one or more edges of the die.

Example A10 provides an IC device that includes a die (or, more generally, a support structure that may be, e.g., a die, a substrate, a carrier substrate, etc.); a first elongated structure (e.g., a fin or a nanoribbon) over the die, the first elongated structure having a first longitudinal axis; a second elongated structure (e.g., a fin or a nanoribbon) over the die, the second elongated structure having a second longitudinal axis; and an memory cell that includes a first inverter structure and a second inverter structure. In such an IC device, the first inverter structure includes a transistor M1 along the first elongated structure and a transistor M2 along the second elongated structure; the second inverter structure includes a transistor M3 along the first elongated structure and a transistor M4 along the second elongated structure; and at least one of the first longitudinal axis and the second longitudinal axis is at an angle between 10 degrees and 80 degrees with respect to one or more edges of the die (and both longitudinal axes being substantially parallel to the plane of the die, e.g., to the plane of the front side or the back side of the die).

Example A11 provides the IC device according to example A10, where an output of the first inverter structure is coupled to a first bitline, an input of the first inverter structure is coupled to a second bitline, an output of the second inverter structure is coupled to the second bitline, and an input of the second inverter structure is coupled to the first bitline.

Example A12 provides the IC device according to example A11, where, during operation of the IC device, a signal on the first bitline is complementary to a signal on the second bitline.

Example A13 provides the IC device according to any one of examples A11-12, where the IC device further includes a first access transistor and a second access transistor; the output of the first inverter structure is coupled to the first bitline by being coupled to the first access transistor and the first access transistor being coupled to the first bitline; the input of the first inverter structure is coupled to the second bitline by being coupled to the second access transistor and the second access transistor being coupled to the second bitline; the output of the second inverter structure is coupled to the second bitline by being coupled to the second access transistor and the second access transistor being coupled to the second bitline; and the input of the second inverter structure is coupled to the first bitline by being coupled to the first access transistor and the first access transistor being coupled to the first bitline.

Example A14 provides the IC device according to any one of examples A11-12, where each of the transistors M1-M4 includes a gate, a first region, and a second region, where one of the first region and the second region is a source region of the transistors M1-M4 and another one of the first region and the second region is a drain region of the transistors M1-M4; the first bitline is coupled to each of the first region of the transistor M1 and the first region of the transistor M2; the second bitline is coupled to each of the gate of the transistor M1 and the gate of the transistor M2; the second bitline is coupled to each of the first region of the transistor M3 and the first region of the transistor M4; and the first bitline is coupled to each of the gate of the transistor M3 and the gate of the transistor M4.

Example A15 provides the IC device according to example A14, where the IC device further includes a transistor M5 and a transistor M6, each including a first region, and a second region, where one of the first region and the second region of the transistors M5-M6 is a source region and another one of the first region and the second region is a drain region of the transistors M5-M6. In such an IC device, the first region and the second region of each of the transistors M5-M6 are in the first elongated structure; each of the first region of the transistor M1 and the first region of the transistor M2 is coupled to the first bitline by being coupled to the first region of the transistor M5 and the second region of the transistor M5 being coupled to the first bitline; and each of the first region of the transistor M3 and the first region of the transistor M4 is coupled to the second bitline by being coupled to the first region of the transistor M6 and the second region of the transistor M6 being coupled to the second bitline.

Example A16 provides the IC device according to example A15, where each of the gate of the transistor M1 and the gate of the transistor M2 is coupled to the second bitline by being coupled to the first region of the transistor M6 and the second region of the transistor M6 being coupled to the second bitline; and each of the gate of the transistor M3 and the gate of the transistor M4 is coupled to the first bitline by being coupled to the first region of the transistor M5 and the second region of the transistor M5 being coupled to the first bitline.

Example A17 provides the IC device according to any one of examples A15-16, where the gate of each of the transistor M5 and the transistor M6 is coupled to a wordline.

Example A18 provides the IC device according to any one of examples A10-17, where the first elongated structure is a first fin extending away from a surface of the die, and the second elongated structure is a second fin extending away from the surface of the die.

Example A19 provides the IC device according to any one of examples A10-17, where the first elongated structure is a first nanowire or nanoribbon extending parallel to a surface of the die, and the second elongated structure is a second nanowire or nanoribbon extending parallel to the surface of the die.

Example A20 provides the IC device according to any one of examples A10-19, where the first elongated structure includes a semiconductor material of a first type, the second elongated structure includes a semiconductor material of a second type, one of the first type and the second type is an N-type semiconductor material and another one of the first type and the second type is a P-type semiconductor material.

Example B1 provides an IC device that includes a die (or, more generally, a support structure that may be, e.g., a die, a substrate, a carrier substrate, etc.); a first elongated structure (e.g., a fin or a nanoribbon) over the die, the first elongated structure having a first longitudinal axis; and a second elongated structure (e.g., a fin or a nanoribbon) over the die, the second elongated structure having a second longitudinal axis. In such an IC device, each of the first elongated structure and the second elongated structure includes a semiconductor material; at least one of the first longitudinal axis and the second longitudinal axis is at an angle between 10 degrees and 80 degrees with respect to one or more edges of the die (and both longitudinal axes being substantially parallel to the plane of the die, e.g., to the plane of the front side or the back side of the die); and a projection of the first longitudinal axis on a plane parallel to a plane of the die intersects a projection of the second longitudinal axis on the plane (e.g., the first and second longitudinal axes are not parallel or overlapping with one another).

Example B2 provides the IC device according to example B1, where one end of the first elongated structure is in contact with one end of the second elongated structure (e.g., the first and second elongated structures may be seen as a continuous elongated structure that changes a direction in which it extends (e.g., has a turn or a bend in it)).

Example B3 provides the IC device according to any one of examples B1-2, further including a plurality of transistors, each including a channel region, a first region, and a second region, where one of the first region and the second region is a source region and another one of the first region and the second region is a drain region; the plurality of transistors includes a first transistor and a second transistor; the channel region of the first transistor is in the first elongated structure; and the channel region of the second transistor is in the second elongated structure.

Example B4 provides the IC device according to example B3, where at least one of the first transistor and the second transistor is part of a memory cell.

Example B5 provides the IC device according to any one of examples B3-4, where the first region of the first transistor is in the first elongated structure, and the first region of the second transistor is in the second elongated structure.

Example B6 provides the IC device according to example B5, where the second region of the first transistor is in the first elongated structure, and the second region of the second transistor is in the second elongated structure (e.g., if the first and second transistors are, respectively, transistors M6 and M5 as shown in the present drawings).

Example B7 provides the IC device according to example B5, where the second region of the first transistor and the second region of the second transistor is a shared second region at an intersection of the first elongated structure and the second elongated structure (e.g., if the first and second transistors are, respectively, transistors M3 and M1 or transistors M4 and M2 as shown in the present drawings).

Example B8 provides the IC device according to example B5, where the second region of the first transistor and the second region of the second transistor is a shared second region where one end of the first elongated structure meets one end of the second elongated structure (e.g., if the first and second transistors are, respectively, transistors M3 and M1 or transistors M4 and M2 as shown in the present drawings).

Example B9 provides the IC device according to any one of examples B7-8, where the plurality of transistors includes a third transistor and a fourth transistor, the channel region of the third transistor is in the first elongated structure, and the channel region of the fourth transistor is in the second elongated structure.

Example B10 provides the IC device according to example B9, where the first region of the first transistor and the first region of the third transistor is a shared first region.

Example B11 provides the IC device according to example B10, where the first region of the second transistor and the first region of the fourth transistor is a shared first region.

Example B12 provides the IC device according to any one of examples B1-11, where the first elongated structure is a first fin extending away from a surface of the die, and the second elongated structure is a second fin extending away from the surface of the die.

Example B13 provides the IC device according to any one of examples B1-11, where the first elongated structure is a first nanowire or nanoribbon extending parallel to a surface of the die, and the second elongated structure is a second nanowire or nanoribbon extending parallel to the surface of the die.

Example B14 provides the IC device according to any one of examples B1-13, further including a third elongated structure (e.g., a fin or a nanoribbon) over the die, the third elongated structure having a third longitudinal axis; and a fourth elongated structure (e.g., a fin or a nanoribbon) over the die, the fourth elongated structure having a fourth longitudinal axis, where each of the third elongated structure and the fourth elongated structure includes a semiconductor material, and a projection of the third longitudinal axis on the plane intersects a projection of the fourth longitudinal axis on the plane (e.g., the third and fourth longitudinal axes are not parallel or overlapping with one another).

Example B15 provides the IC device according to example B14, where the semiconductor material of the first elongated structure and the semiconductor material of the second elongated structure are semiconductor materials of a first type, the semiconductor material of the third elongated structure and the semiconductor material of the fourth elongated structure are semiconductor materials of a second type, and one of the first type and the second type is an N-type semiconductor material and another one of the first type and the second type is a P-type semiconductor material.

Example B16 provides the IC device according to any one of examples B14-15, where the first elongated structure and the third elongated structure are parallel, and the second elongated structure and the fourth elongated structure are parallel.

Example B17 provides the IC device according to any one of examples B14-15, where the first elongated structure and the fourth elongated structure are parallel, and the second elongated structure and the third elongated structure are parallel.

Example B18 provides the IC device according to any one of examples B14-15, where one end of the first elongated structure is in contact with one end of the second elongated structure (e.g., the first and second elongated structures may be seen as one continuous elongated structure that changes a direction in which it extends (e.g., has a turn or a bend in it)); one end of the third elongated structure is in contact with one end of the fourth elongated structure (e.g., the third and fourth elongated structures may be seen as another continuous elongated structure that changes a direction in which it extends (e.g., has a turn or a bend in it)); and when measured in a counterclockwise direction, an angle between the first elongated structure and the second elongated structure is different from an angle between the third elongated structure and the fourth elongated structure.

Example B19 provides the IC device according to any one of examples B14-18, further including a plurality of transistors, each including a channel region, a first region, and a second region, where one of the first region and the second region is a source region and another one of the first region and the second region is a drain region; the plurality of transistors includes transistors M1, M2, M3, and M4; the channel region of the transistor M3 is in the first elongated structure; the channel region of the transistor M1 is in the second elongated structure; the channel region of the transistor M4 is in the third elongated structure; and the channel region of the transistor M2 is in the fourth elongated structure.

Example B20 provides the IC device according to example B19, where the first region of the transistor M3 is in the first elongated structure, the first region of the transistor M1 is in the second elongated structure, and the second region of the transistor M3 and the second region of the transistor M1 is a shared second region at an intersection of the first elongated structure and the second elongated structure.

Example B21 provides the IC device according to example B20, where the first region of the transistor M4 is in the third elongated structure, the first region of the transistor M2 is in the fourth elongated structure, and the second region of the transistor M4 and the second region of the transistor M2 is a shared second region at an intersection of the third elongated structure and the fourth elongated structure.

Example B22 provides the IC device according to any one of examples B19-21, where the gate of the transistor M1 is coupled to the gate of the transistor M2, and the gate of the transistor M3 is coupled to the gate of the transistor M4.

Example B23 provides the IC device according to any one of examples B19-22, where each of the first region of the transistor M1 and the first region of the transistor M2 is coupled to a first bitline, each of the gate of the transistor M1 and the gate of the transistor M2 is coupled to a second bitline, each of the first region of the transistor M3 and the first region of the transistor M4 is coupled to the second bitline, and each of the gate of the transistor M3 and the gate of the transistor M4 is coupled to the first bitline.

Example B24 provides the IC device according to example B23, where, during operation of the IC device, a signal on the first bitline is complementary to a signal on the second bitline.

Example B25 provides the IC device according to any one of examples B19-24, where the transistor M1 and the transistor M2 are part of a first inverter, and the transistor M3 and the transistor M4 are part of a second inverter.

Example B26 provides the IC device according to example B25, where an output of the first inverter is coupled to a first bitline, an input of the first inverter is coupled to a second bitline, an output of the second inverter is coupled to the second bitline, and an input of the second inverter is coupled to the first bitline.

Example B27 provides the IC device according to example B26, where, during operation of the IC device, a signal on the first bitline is complementary to a signal on the second bitline.

Example B28 provides the IC device according to any one of examples B19-27, where the plurality of transistors further includes transistors M5 and M6, the channel region of the transistor M6 is in the first elongated structure, and the channel region of the transistor M5 is in the second elongated structure.

Example B29 provides the IC device according to example B28, where the first region of the transistor M3 and the first region of the transistor M6 is a shared first region.

Example B30 provides the IC device according to example B29, where the first region of the transistor M1 and the first region of the transistor M5 is a shared first region.

Example B31 provides the IC device according to any one of examples B28-30, where the transistors M1-M6 are part of an SRAM cell.

Example B32 provides the IC device according to any one of examples B14-31, where each of the first elongated structure, the second elongated structure, the third elongated structure, and the fourth elongated structure is a fin extending away from a surface of the die.

Example B33 provides the IC device according to any one of examples B14-31, where each of the first elongated structure, the second elongated structure, the third elongated structure, and the fourth elongated structure is a nanowire or a nanoribbon extending parallel to the surface of the die.

Example C1 provides an IC device that includes a substrate (or, more generally, a support structure that may be, e.g., a die, a substrate, a carrier substrate, etc.) having a first face and an opposing second face; and a memory cell including a plurality of transistors. In such an IC device, a first set of one or more transistors of the plurality of transistors is over the first face of the substrate (e.g., closer to the first face than to the second face of the substrate), and a second set of one or more transistors of the plurality of transistors is over the second face of the substrate (e.g., closer to the second face than to the first face of the substrate), coupled to one or more transistors of the first set with one or more interconnects that extend through the substrate.

Example C2 provides the IC device according to example C1, where the memory cell is an SRAM cell that includes storage transistors and access transistors, and where the storage transistors are in the first set and the access transistors are in the second set.

Example C3 provides the IC device according to example C2, where a footprint of the access transistors at least partially overlaps with a footprint of the storage transistors.

Example C4 provides the IC device according to example C2, where a footprint of the access transistors is within a footprint of the storage transistors.

Example C5 provides the IC device according to any one of examples C1-4, where the one or more transistors of the first set have channel regions in one or more elongated structures (e.g., fins or nanoribbons) over the first face of the substrate, the one or more transistors of the second set have channel regions in one or more elongated structures (e.g., fins or nanoribbons) over the second face of the substrate, and a projection of a longitudinal axis of at least one of the one or more elongated structures over the first face and the one or more elongated structures over the second face onto a footprint of the substrate is at an angle between 10 degrees and 80 degrees with respect to one or more edges of the footprint of the substrate.

Example C6 provides the IC device according to example C5, where the plurality of transistors of the memory cell are the transistors of the IC devices of examples A and/or examples B.

Example D1 provides an IC device that includes a support structure (e.g., a die, a substrate, a package substrate, a mechanical support structure, a chip, etc.); a plurality of SRAM cells over the support structure; and a plurality of control lines over the support structure, coupled to individual ones of the plurality of SRAM cells, where each of the SRAM cells includes a plurality of transistors with channel regions in two or more elongated structures (e.g., fins or nanoribbons), and a projection of a longitudinal axis of at least one of the two or more elongated structures onto a plane of the support structure is at an angle between 10 degrees and 80 degrees with respect to one or more edges of the support structure.

Example D2 provides the IC device according to example D1, where a projection of a longitudinal axis of at least one of the control lines onto the plane of the support structure is either parallel or perpendicular with respect to the one or more edges of the support structure.

Example D3 provides the IC device according to example D1, where a projection of a longitudinal axis of at least one of the control lines onto the plane of the support structure is at an angle between 10 degrees and 80 degrees with respect to the one or more edges of the support structure.

Example D4 provides the IC device according to any one of examples D1-3, where the control lines include bitlines.

Example D5 provides the IC device according to any one of examples D1-4, where the control lines include wordlines.

Example D6 provides the IC device according to any one of examples D1-5, where the plurality of transistors include the transistors of the IC devices of examples A and/or examples B and/or examples C.

Example E1 provides the IC device according to any one of the preceding examples A, B, C, or D, where the IC device includes or is a part of a central processing unit.

Example E2 provides the IC device according to any one of the preceding examples A, B, C, or D, where the IC device includes or is a part of a memory device, e.g., a high-bandwidth memory device.

Example E3 provides the IC device according to any one of the preceding examples A, B, C, or D, where the IC device further includes a plurality of memory cells, each of the memory cells including a storage element.

Example E4 provides the IC device according to example E3, where the storage element is one of a capacitor, a magnetoresistive material, a ferroelectric material, or a resistance-changing material.

Example E5 provides the IC device according to any one of the preceding examples A, B, C, or D, where the IC device includes or is a part of a logic circuit.

Example E6 provides the IC device according to any one of the preceding examples A, B, C, or D, where the IC device includes or is a part of input/output circuitry.

Example E7 provides the IC device according to any one of the preceding examples A, B, C, or D, where the IC device includes or is a part of an FPGA transceiver.

Example E8 provides the IC device according to any one of the preceding examples A, B, C, or D, where the IC device includes or is a part of an FPGA logic.

Example E9 provides the IC device according to any one of the preceding examples A, B, C, or D, where the IC device includes or is a part of a power delivery circuitry.

Example E10 provides the IC device according to any one of the preceding examples A, B, C, or D, where the IC device includes or is a part of a III-V amplifier.

Example E11 provides the IC device according to any one of the preceding examples A, B, C, or D, where the IC device includes or is a part of PCIE circuitry or DDR transfer circuitry.

Example E12 provides an IC package that includes a die comprising an IC device according to any one of the preceding examples A, B, C, D, or E; and a further IC component, coupled to the die.

Example E13 provides the IC package according to example E12, where the further IC component includes one of a package substrate, an interposer, or a further IC die.

Example E14 provides a computing device that includes a carrier substrate and an IC device, coupled to the carrier substrate, where the IC device is an IC device according to any one of the preceding examples A, B, C, D, or E, or the IC device is included in the IC package according to any one of examples E12-E13.

Example E15 provides the computing device according to example E14, where the computing device is a wearable or handheld computing device.

Example E16 provides the computing device according to examples E14 or E15, where the computing device further includes one or more communication chips and an antenna.

Example E17 provides the computing device according to any one of examples E14-E16, where the carrier substrate is a motherboard.

Example E18 provides a method of manufacturing an IC device, the method including providing the IC device according to any one of the preceding examples.

The invention claimed is:

1. An integrated circuit (IC) device, comprising:

a substrate having a first face and an opposing second face; and a memory cell comprising a plurality of transistors, wherein:

a first set of one or more transistors of the plurality of transistors is over the first face, a second set of one or more transistors of the plurality of transistors is over the second face, coupled with one or more transistors of the first set with one or more interconnects that extend through the substrate, and a projection of a longitudinal axis of a transistor of the first set or a transistor of the second set onto the substrate is at an angle between about 10 and 80 degrees with respect to one or more edges of the substrate.

2. The IC device according to claim 1, wherein the memory cell is a static random-access memory (SRAM) cell that includes storage transistors and access transistors, and wherein the storage transistors are in the first set, and the access transistors are in the second set.

3. The IC device according to claim 1, wherein a footprint of the second set at least partially overlaps with a footprint of the first set.

4. The IC device according to claim 1, wherein:

each transistor of the plurality of transistors includes a gate, a first region, and a second region, one of the first region and the second region is a source region, another one of the first region and the second region is a drain region, the first set incudes transistors M1, M2, M3, and M4, the first region of the transistor M1 is coupled with the first region of the transistor M2, and the first region of the transistor M3 is coupled with the first region of the transistor M4.

5. The IC device according to claim 4, wherein:

the gate of the transistor M1 is coupled with the gate of the transistor M2, and the gate of the transistor M3 is coupled with the gate of the transistor M4.

6. The IC device according to claim 5, wherein:

each of the first region of the transistor M1 and the first region of the transistor M2 is coupled with a first bitline, each of the gate of the transistor M1 and the gate of the transistor M2 is coupled with a second bitline, each of the first region of the transistor M3 and the first region of the transistor M4 is coupled with the second bitline, and each of the gate of the transistor M3 and the gate of the transistor M4 is coupled with the first bitline.

7. The IC device according to claim 5, wherein:

each of the first region of the transistor M1 and the first region of the transistor M2 is coupled with a first bitline, each of the gate of the transistor M1 and the gate of the transistor M2 is coupled with a second bitline, the first set further includes transistors M5 and M6, each of the first region of the transistor M1 and the first region of the transistor M2 is coupled with the first bitline by being coupled with the first region of the transistor M5 and the second region of the transistor M5 being coupled with the first bitline, each of the gate of the transistor M1 and the gate of the transistor M2 is coupled with the second bitline by being coupled with the first region of the transistor M6 and the second region of the transistor M6 being coupled with the second bitline, each of the first region of the transistor M3 and the first region of the transistor M4 is coupled with the second bitline by being coupled with the first region of the transistor M6 and the second region of the transistor M6 being coupled with the second bitline, and each of the gate of the transistor M3 and the gate of the transistor M4 is coupled with the first bitline by being coupled with the first region of the transistor M5 and the second region of the transistor M5 being coupled with the first bitline.

8. The IC device according to claim 7, wherein the gate of each of the transistor M5 and the transistor M6 is coupled with a wordline.

9. The IC device according to claim 1, wherein:

the substrate and the memory cell are part of a die, and the IC device further includes an IC component coupled with the die.

10. The IC device according to claim 9, wherein the IC component includes one of a package substrate, a circuit board, an interposer, or another die.

11. An integrated circuit (IC) device, comprising:

a die;

a first semiconductor structure over the die, the first semiconductor structure having a first portion and a second portion at an angle less than 180 degrees with respect to one another;

a second semiconductor structure over the die, the second semiconductor structure having a first portion and a second portion at an angle less than 180 degrees with respect to one another;

a plurality of transistors, each comprising a gate, a first region, and a second region, wherein one of the first region and the second region is a source region and another one of the first region and the second region is a drain region, and wherein the plurality of transistors includes transistors M1, M2, M3, and M4;

wherein:

a channel portion of the transistor M1 is in the first portion of the first semiconductor structure, a channel portion of the transistor M2 is in the first portion of the second semiconductor structure, a channel portion of the transistor M3 is in the second portion of the first semiconductor structure, a channel portion of the transistor M4 is in the second portion of the second semiconductor structure, the first region of the transistor M1 is coupled with the first region of the transistor M2, the gate of the transistor M1 is coupled with the gate of the transistor M2, the first region of the transistor M3 is coupled with the first region of the transistor M4, and the gate of the transistor M3 is coupled with the gate of the transistor M4.

12. The IC device according to claim 11, wherein each of the first portion of the first semiconductor structure, the second portion of the first semiconductor structure, the first portion of the second semiconductor structure, and the second portion of the second semiconductor structure is at an angle between 10 degrees and 80 degrees with respect to one or more edges of the die.

13. The IC device according to claim 12, wherein the first portion of the first semiconductor structure is substantially parallel with the first portion of the second semiconductor structure.

14. The IC device according to claim 13, wherein the second portion of the first semiconductor structure is substantially parallel with the second portion of the second semiconductor structure.

15. The IC device according to claim 14, wherein:

the first portion of the first semiconductor structure is materially continuous with the second portion of the first semiconductor structure, and the first portion of the second semiconductor structure is materially continuous with the second portion of the second semiconductor structure.

16. The IC device according to claim 15, wherein:

the plurality of transistors further includes transistors M5 and M6, a channel portion of the transistor M5 is in the first portion of the first semiconductor structure, a channel portion of the transistor M6 is in the second portion of the first semiconductor structure, the first region of the transistor M1 is coupled with the first region of the transistor M5, and the first region of the transistor M3 is coupled with the first region of the transistor M6.

17. The IC device according to claim 12, wherein the first portion of the first semiconductor structure is substantially parallel with the second portion of the second semiconductor structure.

18. The IC device according to claim 17, wherein the second portion of the first semiconductor structure is substantially parallel with the first portion of the second semiconductor structure.

19. The IC device according to claim 18, wherein:

the first portion of the first semiconductor structure is materially continuous with the second portion of the first semiconductor structure, and the first portion of the second semiconductor structure is materially continuous with the second portion of the second semiconductor structure.

20. The IC device according to claim 19, wherein:

the plurality of transistors further includes transistors M5 and M6, a channel portion of the transistor M5 is in the first portion of the first semiconductor structure, a channel portion of the transistor M6 is in the second portion of the first semiconductor structure, the first region of the transistor M1 is coupled with the first region of the transistor M5, and the first region of the transistor M3 is coupled with the first region of the transistor M6.

* * * * *